(12) United States Patent
Shcheglov et al.

(10) Patent No.: US 6,944,931 B2
(45) Date of Patent: Sep. 20, 2005

(54) METHOD OF PRODUCING AN INTEGRAL RESONATOR SENSOR AND CASE

(75) Inventors: Kirill V. Shcheglov, Los Angeles, CA (US); A. Dorian Challoner, Manhattan Beach, CA (US); Ken J. Hayworth, Pasadena, CA (US); Dean V. Wiberg, LaCrescenta, CA (US); Karl Y. Yee, Pasadena, CA (US)

(73) Assignees: The Boeing Company, Chicago, IL (US); California Institute of Technology, Pasadena, CA (US)

( * ) Notice: Subject to any disclaimer, the term of this patent is extended or adjusted under 35 U.S.C. 154(b) by 0 days.

(21) Appl. No.: 10/639,135

(22) Filed: Aug. 12, 2003

(65) Prior Publication Data

US 2004/0055381 A1 Mar. 25, 2004

Related U.S. Application Data

(60) Provisional application No. 60/428,451, filed on Nov. 22, 2002, and provisional application No. 60/402,681, filed on Aug. 12, 2002.

(51) Int. Cl.$^7$ ................................................ G01R 3/00
(52) U.S. Cl. ...................... 29/595; 29/592.1; 29/602.1; 216/65; 451/5; 451/41; 361/283; 361/301
(58) Field of Search ............................. 29/592.1, 595, 29/602.1; 216/65; 451/5, 41; 361/283, 301

(56) References Cited

U.S. PATENT DOCUMENTS

| | | | |
|---|---|---|---|
| 392,650 A | 11/1888 | Watrous | |
| 4,898,031 A | * 2/1990 | Oikawa et al. | .......... 73/504.12 |
| 5,226,321 A | 7/1993 | Varnham et al. | |
| 5,421,312 A | * 6/1995 | Dawson | ...................... 123/620 |
| 5,646,346 A | 7/1997 | Okada | |
| 5,665,915 A | 9/1997 | Kobayashi et al. | |
| 5,783,749 A | 7/1998 | Lee et al. | |
| 5,894,090 A | 4/1999 | Tang et al. | |
| 5,905,202 A | 5/1999 | Kubena et al. | |
| 5,920,012 A | 7/1999 | Pinson | |
| 6,009,751 A | 1/2000 | Ljung | |
| 6,044,705 A | 4/2000 | Neukermans et al. | |
| 6,164,134 A | 12/2000 | Cargille | |
| 6,182,352 B1 | * 2/2001 | Deschenes et al. | ........ 29/602.1 |
| 6,263,552 B1 | * 7/2001 | Takeuchi et al. | ........... 29/25.35 |
| 6,282,958 B1 | 9/2001 | Fell et al. | |
| 6,289,733 B1 | 9/2001 | Challoner et al. | |
| 6,367,786 B1 | 4/2002 | Gutierrez et al. | |
| 6,515,278 B2 | 2/2003 | Wine et al. | |

FOREIGN PATENT DOCUMENTS

| | | | |
|---|---|---|---|
| DE | 44 42 033 A1 | 5/1996 | |
| JP | 01129517 A | * 5/1989 | ............ H03H/3/08 |
| WO | WO 96/38710 | 12/1996 | |
| WO | WO 98/15799 | 4/1998 | |

OTHER PUBLICATIONS

"Planar resonator sensor for moisture measurements"; Skulski, J.; Galwas, B.A.; Microwaves and Radar, 1998. MIKON '98., 12th International Conference on , vol.: 3, May 20–22, 1998; pp.: 692–695.*

(Continued)

*Primary Examiner*—A. Dexter Tugbang
*Assistant Examiner*—Paul D Kim
(74) *Attorney, Agent, or Firm*—Origin Law; Bradley K. Lortz

(57) ABSTRACT

The present invention discloses an inertial sensor having an integral resonator. A typical sensor comprises a planar mechanical resonator for sensing motion of the inertial sensor and a case for housing the resonator. The resonator and a wall of the case are defined through an etching process. A typical method of producing the resonator includes etching a baseplate, bonding a wafer to the etched baseplate, through etching the wafer to form a planar mechanical resonator and the wall of the case and bonding an end cap wafer to the wall to complete the case.

51 Claims, 36 Drawing Sheets

OTHER PUBLICATIONS

D. Wright et al., "The HRG Applied to a Satellite Attitude Reference System," Guidance and Control, American Astronautical Society, Advances in Astronautical Sciences, 1994, 86:1–13.

M.W. Putty et al., "A Micromachined Vibrating Ring Gyroscope," Solid State Sensor and Actuator Workshop, Transducer Research Foundation, Hilton Head, 1994, pp. 213–220.

T.K. Tang et al., "Silicon Bulk Micromachined Vibratory Gyroscope," Solid State Sensor and Actuator Workshop, Transducer Research Foundation, Hilton Head, South Carolina, Jun. 2–6, 1996, 6 pgs.

N. Barbour et al., "Micromechanical Silicon Instrument and Systems Development at Draper Laboratory," AIAA Guidance Navigation and Control Conference, American Institute of Aeronautics and Astronautics, San Diego, CA, Jul. 29–31, 1996, Paper No. 96-3709, pp. 1–7.

J.D. Johnson et al., "Surface Micromachined Angular Rate Sensor," A1995 SAE Conference, Paper No. 950538, pp. 77–83.

* cited by examiner

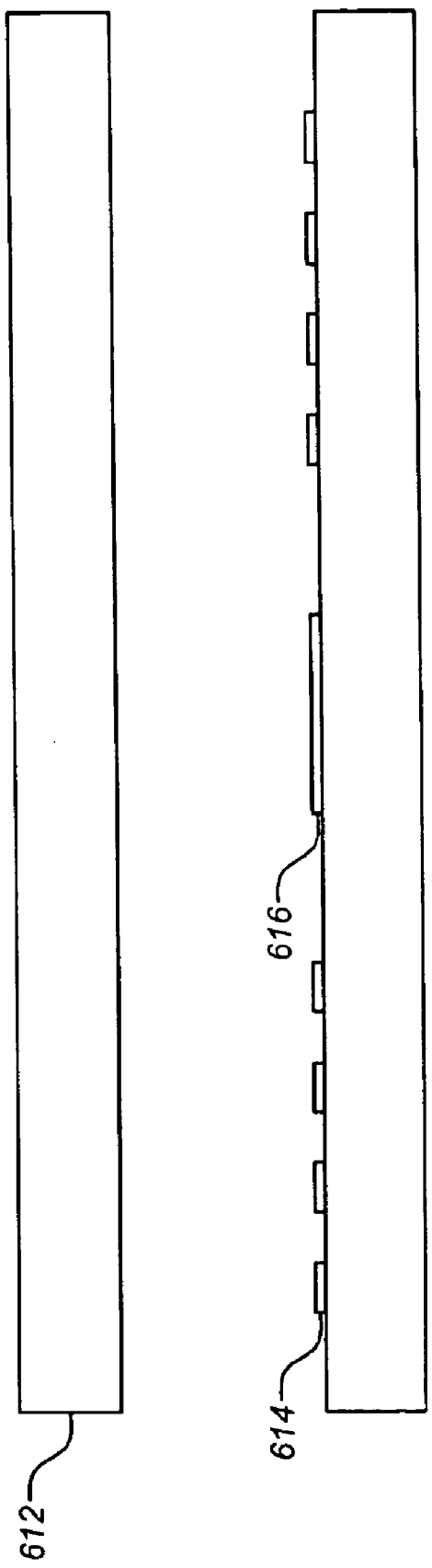

METHOD OF PRODUCING AN INTEGRAL RESONATOR SENSOR AND CASE

CROSS-REFERENCE TO RELATED APPLICATIONS

This application claims the benefit under 35 U.S.C. §119 (e) of the following U.S. provisional patent applications, which are all incorporated by reference herein:

U.S. Provisional Patent Application No. 60/402,681, filed Aug. 12, 2002, and entitled "CYLINDER GYROSCOPE WITH INTEGRAL SENSING AND ACTUATION", by Kirill V. Shcheglov and A. Dorian Challoner; and U.S. Provisional Patent Application No. 60/428,451, filed Nov. 22, 2002, and entitled "DESIGN AND FABRICATION PROCESS FOR A NOVEL HIGH PERFORMANCE MESOGYRO", by Kirill V. Shcheglov and A. Dorian Challoner.

This application is related to the following co-pending applications, which are all incorporated by reference herein:

U.S. patent application Ser. No. 09/928,279, filed Aug. 10, 2001, and entitled "ISOLATED RESONATOR GYROSCOPE", by A. Dorian Challoner which issued Oct. 7, 2003 as U.S. Pat. No. 6,629,460;

U.S. patent application No. 10/370,953, filed Feb. 20, 2003, and entitled "ISOLATED RESONATOR GYROSCOPE WITH A DRIVE AND SENSE FRAME", by A. Dorian Challoner and Kirill V. Shcheglov;

U.S. patent application Ser. No. 10/423,459, filed Apr. 25, 2003, and entitled "ISOLATED RESONATOR GYROSCOPE WITH ISOLATION TRIMMING USING A SECONDARY ELEMENT", by A. Dorian Challoner and Kirill V. Shcheglov;

U.S. patent application Ser. No. 10/410,744, filed Apr. 10, 2003, and entitled "ISOLATED RESONATOR GYROSCOPE WITH COMPACT FLEXURES", by A. Dorian Challoner and Kirill V. Shcheglov;

U.S. patent application Ser. No. 10/285,886, filed Nov. 1, 2002, and entitled "MICROGYRO TUNING USING FOCUSED ION BEAMS", by Randall L. Kubena et al. which issued Mar. 2, 2004 as U.S. Pat. No. 6,698,287;

U.S. patent application Ser. No. 10/603,557, filed Jun. 25, 2003, and entitled "INTEGRATED LOW POWER DIGITAL GYRO CONTROL ELECTRONICS", by Rober M'Closkey et al.; and U.S. patent application Ser. No. 10/639,134, filed on this same day herewith, and entitled "ISOLATED PLANAR GYROSCOPE WITH INTERNAL RADIAL SENSING AND ACTUATION", by Kirill V. Shcheglov and A. Dorian Challoner.

STATEMENT OF GOVERNMENT RIGHTS

The invention described herein was made in the performance of work under a NASA contract, and is subject to the provisions of Public Law 96-517 (35 U.S.C. 202) in which the Contractor has elected to retain title.

BACKGROUND OF THE INVENTION

1. Field of the Invention

The present invention relates to manufacturing gyroscopes, and in particular to manufacturing resonator microgyroscopes or inertial sensors. More particularly, this invention relates to manufacturing isolated resonator inertial sensors and microgyroscopes with an integral case.

2. Description of the Related Art

Mechanical gyroscopes are used to determine direction of a moving platform based upon the sensed inertial reaction of an internally moving proof mass. A typical electromechanical gyroscope comprises a suspended proof mass, gyroscope case, pickoffs, or sensors, torquers, or actuators and readout electronics. The inertial proof mass is internally suspended from the gyroscope case that is rigidly mounted to the platform and communicates the inertial motion of the platform while otherwise isolating the proof mass from external disturbances. The pickoffs to sense the internal motion of the proof mass, the torquers to maintain or adjust this motion and the readout electronics that must be in close proximity to the proof mass are internally mounted to the case which also provides the electrical feedthrough connections to the platform electronics and power supply. The case also provides a standard mechanical interface to attach and align the gyroscope with the vehicle platform. In various forms gyroscopes are often employed as a critical sensor for vehicles such as aircraft and spacecraft. They are generally useful for navigation or whenever it is necessary to autonomously determine the orientation of a free object.

Older conventional mechanical gyroscopes were very heavy mechanisms by current standards, employing relatively large spinning masses. A number of recent technologies have brought new forms of gyroscopes, including optical gyroscopes such as laser gyroscopes and fiberoptic gyroscopes as well as mechanical vibratory gyroscopes.

Spacecraft generally depend on inertial rate sensing equipment to supplement attitude control. Currently this is often performed with expensive conventional spinning mass gyros (e.g., a Kearfott inertial reference unit) or conventionally-machined vibratory gyroscopes (e.g. a Litton hemispherical resonator gyroscope inertial reference unit). However, both of these are very expensive, large and heavy.

In addition, although some prior symmetric vibratory gyroscopes have been produced, their vibratory momentum is transferred through the case directly to the vehicle platform. This transfer or coupling admits external disturbances and energy loss indistinguishable from inertial rate input and hence leads to sensing errors and drift. One example of such a vibratory gyroscope may be found in U.S. Pat. No. 5,894,090 to Tang et al. which describes a symmetric cloverleaf vibratory gyroscope design and is hereby incorporated by reference herein. Other planar tuning fork gyroscopes may achieve a degree of isolation of the vibration from the baseplate, however these gyroscopes lack the vibrational symmetry desirable for tuned operation.

In addition, shell mode gyroscopes, such as the hemispherical resonator gyroscope and the vibrating thin ring gyroscope, are known to have some desirable isolation and vibrational symmetry attributes. However, these designs are not suitable for or have significant limitations with thin planar silicon microfabrication. The hemispherical resonator employs the extensive cylindrical sides of the hemisphere for sensitive electrostatic sensors and effective actuators. However its high aspect ratio and 3D curved geometry is unsuitable for inexpensive thin planar silicon microfabrication. The thin ring gyroscope (e.g., U.S. Pat. No. 6,282,958, which is incorporated by reference herein) while suitable for planar silicon microfabrication, lacks electrostatic sensors and actuators that take advantage of the extensive planar area of the device. Moreover, the case for this gyroscope is not of the same material as the resonator proof mass so that the alignment of the pickoffs and torquers relative to the resonator proof mass change with temperature, resulting in gyroscope drift.

Vibration isolation using a low-frequency seismic support of the case or of the resonator, internal to the case is also known (e.g., U.S. Pat. No. 6,009,751, which is incorporated by reference herein). However such increased isolation comes at the expense of proportionately heavier seismic mass and/or lower support frequency. Both effects are undesirable for compact tactical inertial measurement unit (MU) applications because of proof mass misalignment under acceleration conditions.

Furthermore, the scale of previous silicon microgyroscopes (e.g., U.S. Pat. No. 5,894,090) can not been optimized for navigation or pointing performance resulting in higher noise and drift than desired. This problem stems from dependence on out of plane bending of thin epitaxially grown silicon flexures to define critical vibration frequencies that are limited to 0.1% thickness accuracy. Consequently device sizes are limited to a few millimeters. Such designs exhibit high drift due to vibrational asymmetry or unbalance and high rate noise due to lower mass which increases thermal mechanical noise and lower capacitance sensor area which increases rate errors due to sensor electronics noise.

Scaling up of non-isolated silicon microgyros is also problematic because external energy losses will increase with no improvement in resonator Q and no reduction in case-sensitive drift. An isolated cm-scale resonator with many orders of magnitude improvement in 3D manufacturing precision is required for very low noise pointing or navigation performance.

Conventionally machined navigation grade resonators such as quartz hemispherical or shell gyros have the optimum noise and drift performance at large scale, e.g. 30 mm and 3D manufacturing precision, however such gyros are expensive and time-consuming to manufacture. Micromachined silicon vibratory gyroscopes have lower losses and better drift performance at smaller scale but pickoff noise increases and mechanical precision decreases at smaller scale so there are limits to scaling down with conventional silicon designs. Conventional laser trimming of mechanical resonators can further improve manufacturing precision to some degree. However this process is not suitable for microgyros with narrow mechanical gaps and has limited resolution, necessitating larger electrostatic bias adjustments in the final tuning process.

In addition, conventional resonator gyroscopes also generally require a housing or case to be provided separately from the production of the resonator. One reason for this approach is due to the fact that the gyroscope should be provided a vacuum case. No gyroscope design has been developed which allows a vacuum case to be produced as part of the manufacturing process of the resonator. Thus, enclosing the gyro has been a problem distinct from manufacture of the resonator. This complicates the manufacturing and adds to the expense of such resonator gyroscopes.

There is a need in the art for resonator gyroscopes that can be produced integrally with their case. Further there is a need for such gyroscopes to be produced with an integral vacuum case. In addition, there is a need for such gyroscopes with equal or better performance than comparable resonator gyroscopes requiring a separate case. As detailed below, the present invention satisfies all these and other needs.

SUMMARY OF THE INVENTION

Embodiments of the present invention provide a planar resonator supported on a central rigid stem and with substantially increased sensing capability by utilizing a short solid cylindrical resonator or disc having a substantial useable internal resonator volume, allowing the incorporation of significantly more sensing for the measurement of desirable resonator internal motion. This use of a planar element, such as a disc, rather than a shell or ring results in substantial top and bottom surface areas and a large internal volume for mounting additional sensors. A disc provides the same favorable modes for Coriolis sensing as a cylindrical or hemispherical shell.

A typical embodiment of the present invention comprises an inertial sensor including a planar mechanical resonator for substantially in-plane vibration and having a central mounting point, a rigid support for the resonator at the central mounting point. Excitation elements are disposed within an interior of the resonator to excite in-plane vibration of the resonator and sensing elements are disposed within the interior of the resonator for sensing the internal motion of the excited resonator. In one embodiment, the planar resonator includes a plurality of slots in an annular pattern.

In one embodiment of the invention, multiple concentric alternating segments or slots can be cut or etched through the disc, reducing the in-plane stiffness of the resonator. In addition, the segmented or slotted disc also obtains an increased area available for capacitive sensing. The advantages of this structure include permitting larger deflections with increased sensitivity. Alternatively, in-plane strain gauges can be placed on the top and bottom surfaces of a solid disc to provide a constant sensing area, regardless of the disc thickness. However, this approach will produce a resonator with an increased in-plane stiffness when compared with the segmented or slotted approach.

Because the resonator is planar, it's manufacture is conveniently facilitated through known wafer manufacturing technologies. In addition, the planar resonator allows an integral case (particularly a vacuum case) to be produced as part of the manufacturing process of the resonator. For example, the planar resonator can be produced by reactive ion etching (RIE) the resonator from silicon bonded in place on a supporting silicon baseplate. Electrode support pillars and interconnect wiring can be etched and deposited on the baseplate before bonding. The etching process can thus be used to simultaneously produce the torquer excitation and pickoff sensing electrodes along with the resonator and a portion of the gyroscope case or case, including a wall surrounding the resonator and an endplate. A third silicon wafer comprising the readout electronics and electrode interconnections can also be bonded to the resonator to complete the gyroscope case.

A typical sensor comprises a planar mechanical resonator for sensing motion of the inertial sensor and a case for housing the resonator. The resonator and a wall of the case are defined through an etching process. A typical method of producing the resonator includes etching a baseplate, bonding a wafer to the etched baseplate, through etching the wafer to form a planar mechanical resonator and the wall of the case and bonding an end cap wafer to the wall to complete the case.

The integral case can be produced as a vacuum housing. Metal bonding can be used to fuse the baseplate to the wall and the wall to the end cap wafer. Electrical connection for exciting and sensing the resonator can be provided by connect pins and/or metal traces passing through the case. Excitation and sensing electrodes can be disposed within an interior of the planar mechanical resonator. These electrodes can be formed when the resonator is through etched from the same wafer as the resonator case wall. Furthermore, the end cap wafer can include readout electronics for the inertial sensor.

The planar resonator can be designed to comprise a plurality slots. Further, the slots can be arranged in an annular pattern around a central mounting point of the resonator. The slots can be arranged in a symmetric pattern with substantially uniform radial spacing around the central mounting point. The excitation and/or sensing electrodes can be disposed in the slots. The slots and electrodes can be formed in the same etching process; through etching the slots leaves the electrodes bonded to the baseplate.

In addition, in further embodiments of the invention, the planar resonator can comprise four masses, each having a simple degenerate pair of in-plane vibration modes and all being centrally supported. The planar mechanical resonator can be designed with two degenerate in-plane system modes producing symmetric motion of the four masses for Coriolis sensing.

BRIEF DESCRIPTION OF THE DRAWINGS

Referring now to the drawings in which like reference numbers represent corresponding parts throughout:

FIGS. 3A–3J illustrate strain energy within a finite element model of an exemplary solid planar resonator gyroscope in various modes;

FIGS. 6A–6C depicts various stages of an exemplary manufacturing process for the invention;

DETAILED DESCRIPTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

1.0 Overview

Embodiments of the present invention generally describe an isolated planar vibratory gyroscope. Generally, embodiments of the invention employ embedded sensing and actuation providing a planar micromachined silicon gyroscope having desirable axisymmetric resonator with single central nodal support, integral (and distributed) proof mass and flexural suspension and extensive capacitive electrodes with large total area. Advantageously, the entire resonator, embedded electrodes and integral case wall of the present invention can be fabricated from a single wafer of silicon.

Silicon ring resonators (e.g., U.S. Pat. No. 6,282,958) do not have large area internal capacitive sensors and actuators and require flexible support beams. Other quartz hemispherical resonator gyroscopes are three dimensional so they cannot be micromachined and do not have embedded electrodes. Although post mass type resonator gyroscopes have high angular gain, large area sensing elements and hence superior noise performance to other designs, they do not have the optimized resonator isolation properties of a single central nodal support and often employ a discretely assembled post proof mass. Further, integrally made, fully differential embedded electrodes as with the present invention, desirable for better thermal and vibration performance, are not possible with a discrete post proof mass resonator gyroscope or out of plane gyroscope.

The principal problems with ring gyroscopes are the inherently small sensor area around a thin ring and the flexibility or interaction of the support beams. A three dimensional hemispherical gyroscope has taller sides for large area capacitive sensing, but still requires assembly of a discrete circumferential electrode cylinder or cup for sensing and excitation. A tall cylinder with central support and circumferential electrodes also faces this problem. A short solid cylinder or disc with a central support and piezoelectric and/or electromagnetic wire sensors and actuators, mounted to the top or bottom surface of the disc solves the problem of non-embedded sensors with small area. However, a preferred embodiment of this invention is a multiply slotted disc resonator with capacitive sensing and actuation illustrated in exemplary embodiment described hereafter.

2.0 Exemplary Planar Resonator Gyroscope Embodiment

Figure 1A:
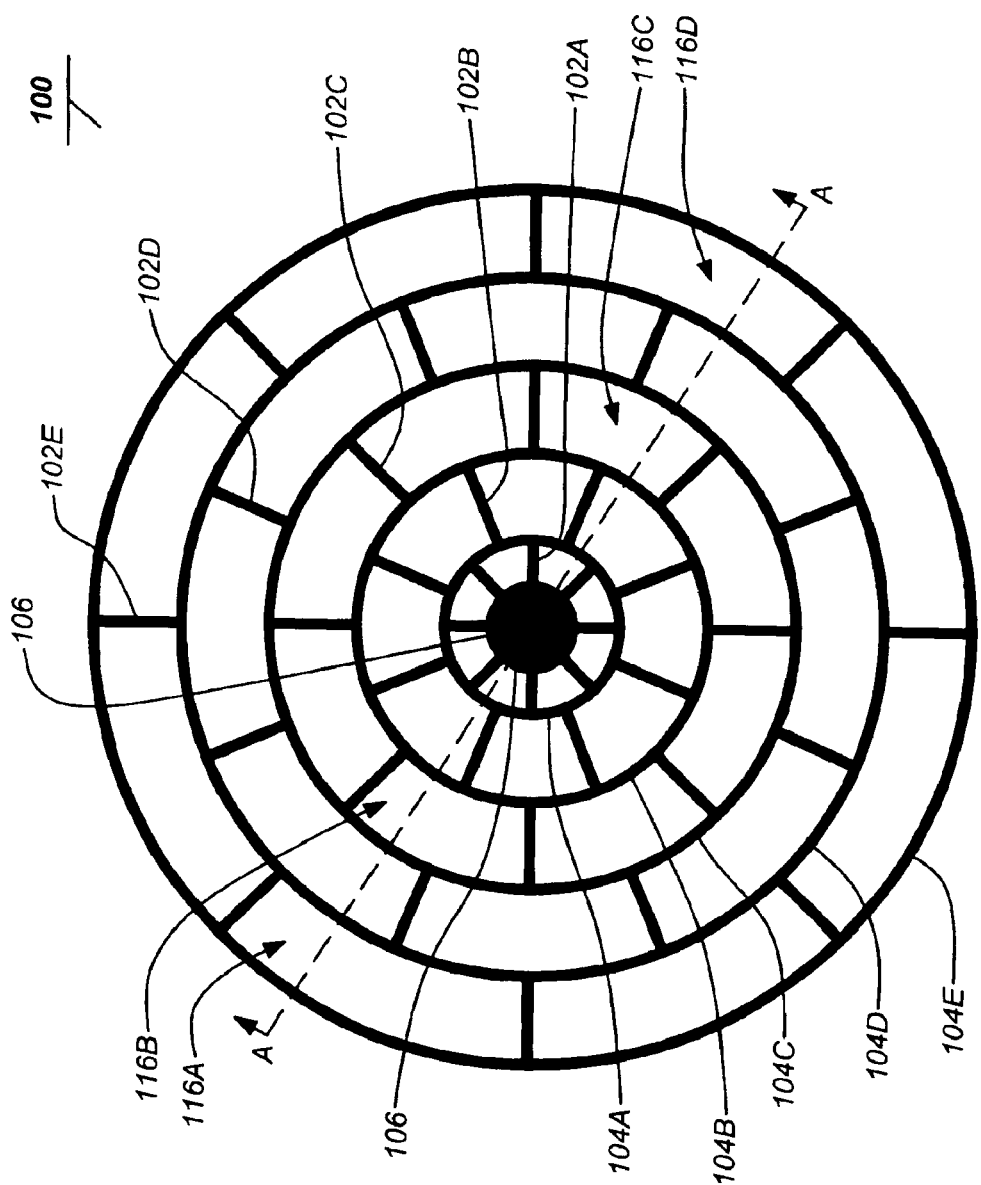
FIG. 1A depicts a top view of an exemplary planar resonator gyroscope of the present invention.

FIG. 1A depicts a schematic top view of an isolated resonator for the gyroscope or inertial sensor embodiment of the present invention. The gyroscope comprises a unique planar resonator 100 which is supported by a rigid central support 106 and designed for in-plane vibration. In the exemplary embodiment, the resonator 100 comprises a disc that includes a number of slots, e.g. 116A–116D (generally referenced as 116) formed from concentric circumferential segments 104A–104E. The circumferential segments 104A–104E are supported by radial segments 102A–102E. The overall diameter of the resonator can be varied depending upon the performance requirements. For example, a 16 mm diameter resonator can provide relatively high machining precision and low noise. Further refinement of the resonator can yield a resonator diameter of only 4 mm at significantly reduced cost.

Figure 1B:
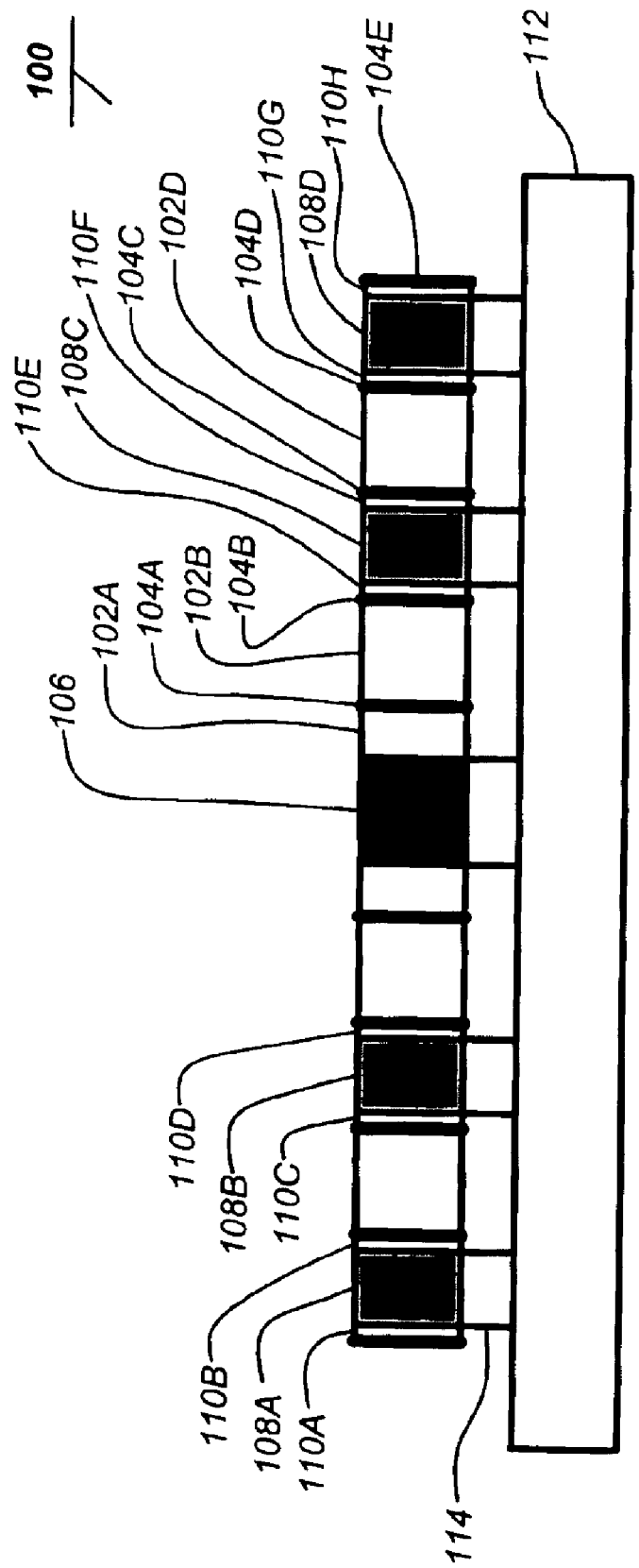
FIG. 1B depicts a side view of an exemplary planar resonator gyroscope of the present invention.

FIG. 1B depicts a schematic side view of an exemplary isolated resonator 100 of the present invention assembled into a baseplate 112. The central support 106 supports the resonator 100 on the baseplate 112. At least some of the slots 116 in the resonator 100 provide access for the embedded electrodes 108A–108D which are also supported on pillars 114 on the baseplate 112. The electrodes 108A–108D form capacitive gaps 110A–110H (outward gaps 110A, 110C, 110F and 110H and inward gaps 110B, 110D, 110E and 110G) with at least some of the circumferential segments 104A–104E of the resonator 100. These electrodes 108A–108D provide for radial excitation of the resonator 100 as well as sensing motion of the resonator 100. To facilitate this each of the electrodes 108A–108D is divided into multiple separate elements to improve control and sensing of the resonator. For example, the annular electrode 108B as shown can be divided into two or more elements, at least one acting across the outward gap 110C and at least one acting across the inward gap 110D. Vibration is induced in the resonator by separately exciting the elements to produce a biased reaction on the resonator 100 at the electrode 108B location.

In general, the excitation electrodes 108B, 108C are disposed closer to the central support 106 (i.e., within inner slots of the resonator 100) than the electrodes 108A, 108D (i.e. within outer slots of the resonator 100) to improve sensing. However, the arrangement and distribution of the excitation and sensing electrodes 108A–108D can be varied as desired. In further embodiments, additional electrodes can also be used to bias the resonator 100 providing electrostatic tuning. Such biasing electrodes can also include multiple separate elements as the excitation and sensing electrodes.

Figure 1C:
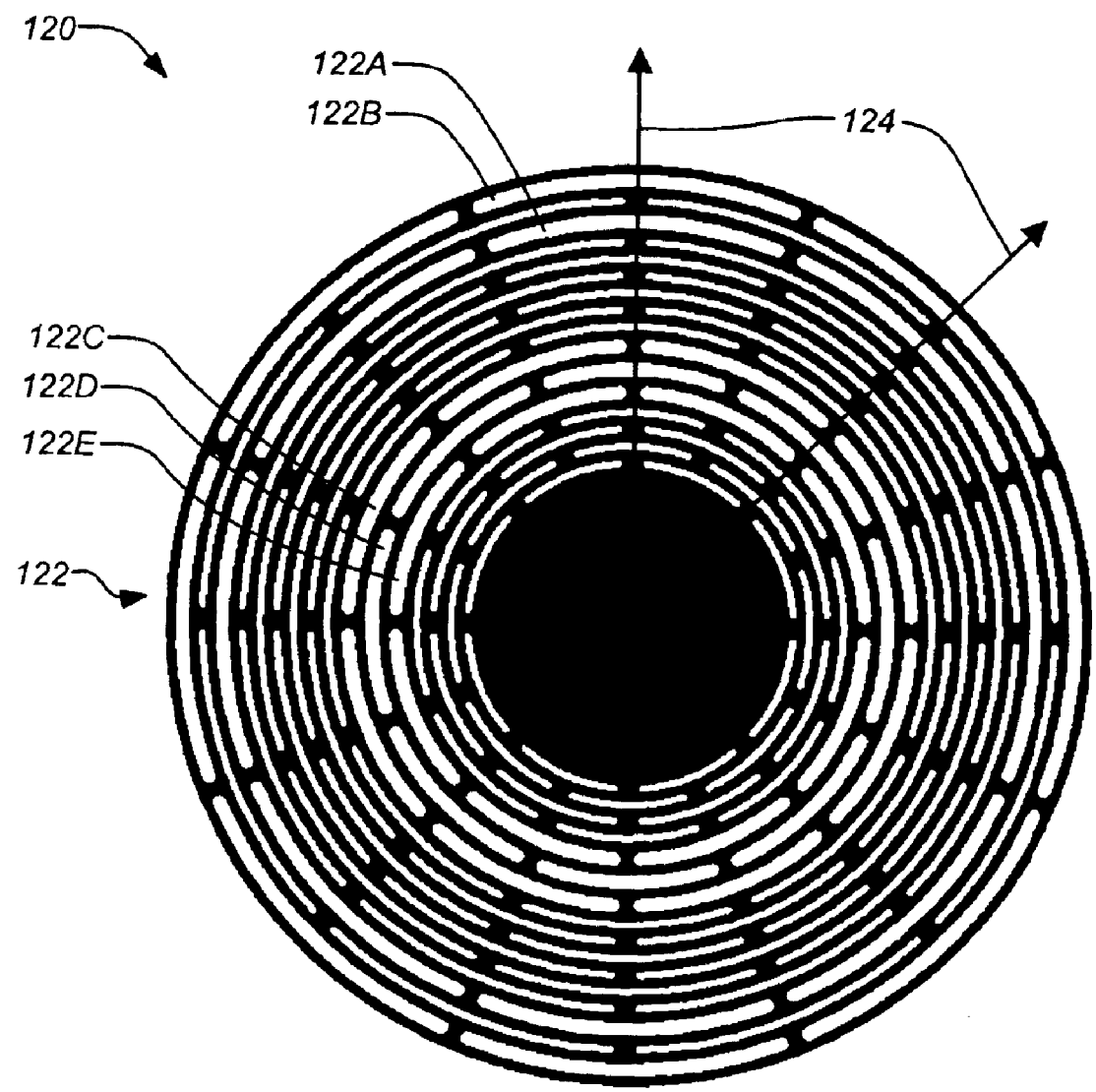
FIG. 1C illustrates a pattern for an exemplary planar resonator of the present invention.

FIG. 1C illustrates a pattern 120 for an exemplary planar resonator 100 of the present invention. This pattern 120 employs numerous concentric interleaved circumferential slots 122. Some of the slots, e.g. 122A–122E are wider to accommodate multiple element electrodes. For example, two of the outer rings of wider slots 122A, 122B are for the sensing electrodes and three of the inner rings of wider slots are for the driving electrodes. The remaining slots 122 can serve to structurally tune the resonator 100 (e.g., lower the frequency) and/or they may be occupied by bias electrodes which are used to actively bias the resonator in operation. The resonator and modal axes 124 are indicated; operation of the resonator identifies them as the pattern 120 is symmetric.

Although the exemplary resonator 100 is shown as a disc, other planar geometries using internal sensing and actuation are also possible applying principles of the present invention. In addition, furthermore, the single central support 106 is desirable, providing complete isolation of the resonator, however, other mounting configurations using one or more additional mounting supports are also possible.

As employed in the resonator 100 described above, a centrally supported solid cylinder or disc has two degenerate in-plane modes suitable for Coriolis sensing, however the frequencies are very high (greater than 100 KHz) and the radial capacitance sensing area diminishes with cylinder height or disc thickness. However, the multi-slotted disc resonator 100, shown in FIGS. 1A and 1B overcomes these problems. By etching multiple annular slots through the cylinder or disc two immediate benefits result: two degenerate modes suitable for Coriolis sensing with low frequency (less than 50 KHz) and large sense, bias and drive capacitance. The low frequency derives from the increased in-plane compliance provided by the slots. The large sense, bias and drive capacitance is a consequence of the large number of slots that can be machined into the resonator.

Figure 1D:
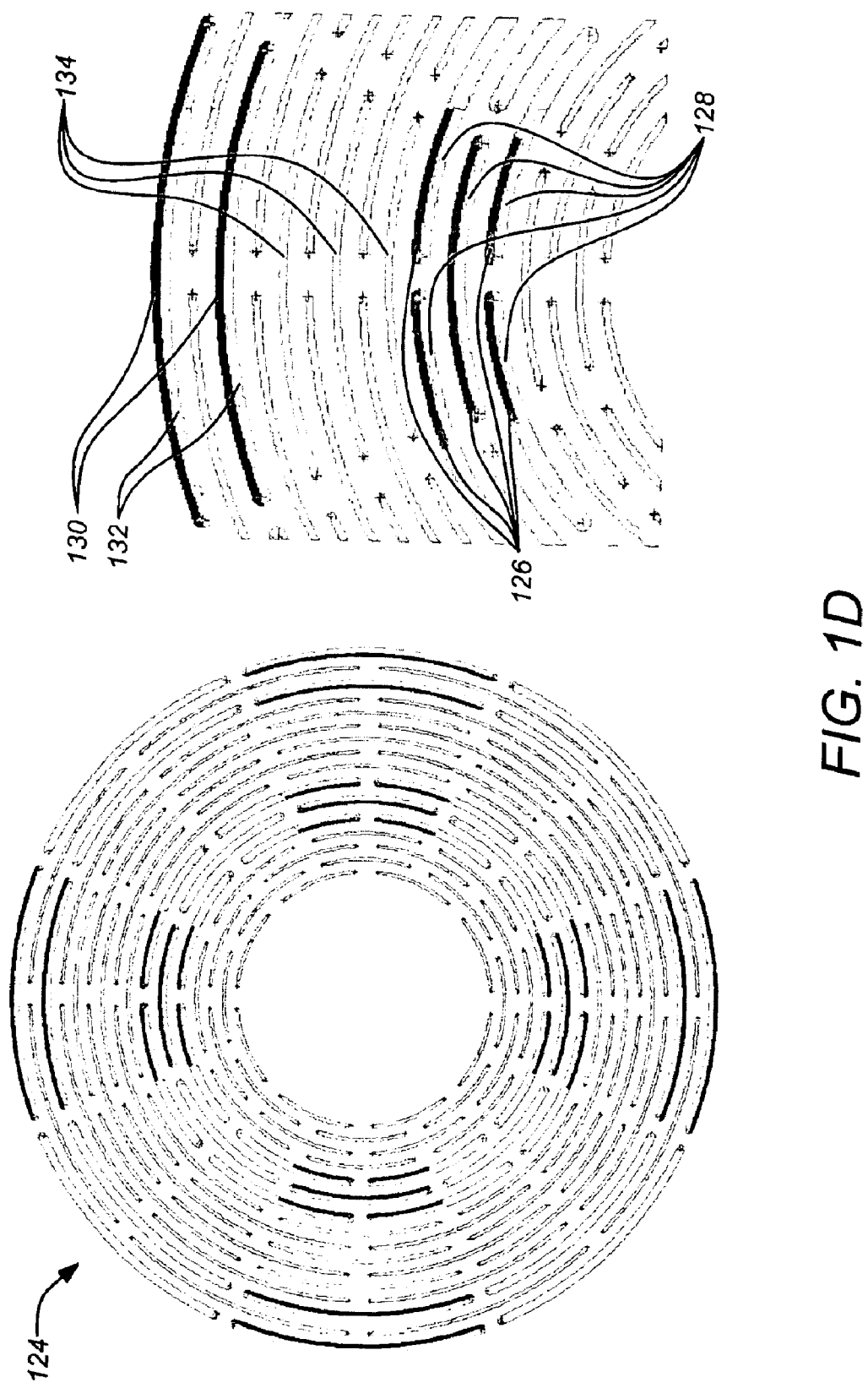
FIG. 1D illustrates electrode operation for a first mode of an exemplary resonator.

FIG. 1D illustrates electrode operation for a first mode of the resonator of FIG. 1C. The electrodes 124 that operate with a resonator 100 of the pattern 120 are shown in the left image. Four groups of electrodes 124 are used, each at a 90° interval around the circumference of the pattern. The positive excitation elements 126 and negative excitation elements 128, paired elements of the excitation electrodes, are driven to excite the resonator 100. These paired elements 126, 128 share a slot with the positive elements 126 in the outward position and the negative elements 128 in the inward position. Note also that as shown some of the pairs share a common slot with other distinct electrode pairs, illustrating that multiple separately operable electrodes can share a common resonator slot. The sensing electrodes are disposed at a larger radial position and include positive sensing elements 130 and negative sensing elements 132 which together provide output regarding motion of the resonator 100.

A uniform radial spacing between slots 116, 122 can be employed, but other spacing may also be used, provided two degenerate in-plane modes suitable for Coriolis sensing are maintained. In addition, in further embodiments, some or all of the segments 104A–104E can be further slotted such that a single beam segment is further divided into a composite segment including multiple parallel segments. Selective use of such composite segments can be used to adjust the frequency of the resonator as well as eliminate harmful thermoelastic effects on drift performance as the segments are stressed in operation of the resonator. Generally, adding slots to form composite circumferential segments lowers the resonator frequency. The effect of machining errors is also mitigated with multiple slots. Although such composite segments are preferably applied to the circumferential segments 104A–104E, the technique can also be applied to the radial segments 102A–102E or other designs with other segments in other resonator patterns.

Employing the in-plane design described, embodiments of the present invention obtain many advantages over other out-of-plane gyros. For example, the central support bond carries no vibratory loads, eliminating any friction possibility or anchor loss variability. In addition, simultaneous photolithographic machining of the resonator and electrodes is achieved via the slots. Furthermore, diametral electrode capacitances can be summed to eliminate vibration rectification and axial vibration does not change capacitance to a first order. Modal symmetry is also largely determined by photolithographic symmetry not wafer thickness as with other designs. Isolation and optimization of sense capacitance (e.g., from the outer slots) and drive capacitance (e.g., from the inner slots) is achieved. Embodiments of the invention also achieve a geometric scalable design to smaller or larger diameters and thinner or thicker wafers. In addition, embodiments of the invention can be entirely defined by slots of the same width for machining uniformity and symmetry. Implementation of the present invention can also accommodate silicon anisotropy producing frequency splits. For example, a <111> silicon wafer and/or a varied slot width can be used.

As mentioned above, high thermoelastic damping due to vibration frequency proximity to thermal relaxation resonance can result in short resonance decay times and high gyro drift. However, the slot radial spacing can be adjusted to define an optimum beam width and a number of slots can be additionally etched in between the slots defining the electrode gaps to further reduce the vibrating beam width.

3.0 Planar Isolated Resonator Model

Figure 2A:
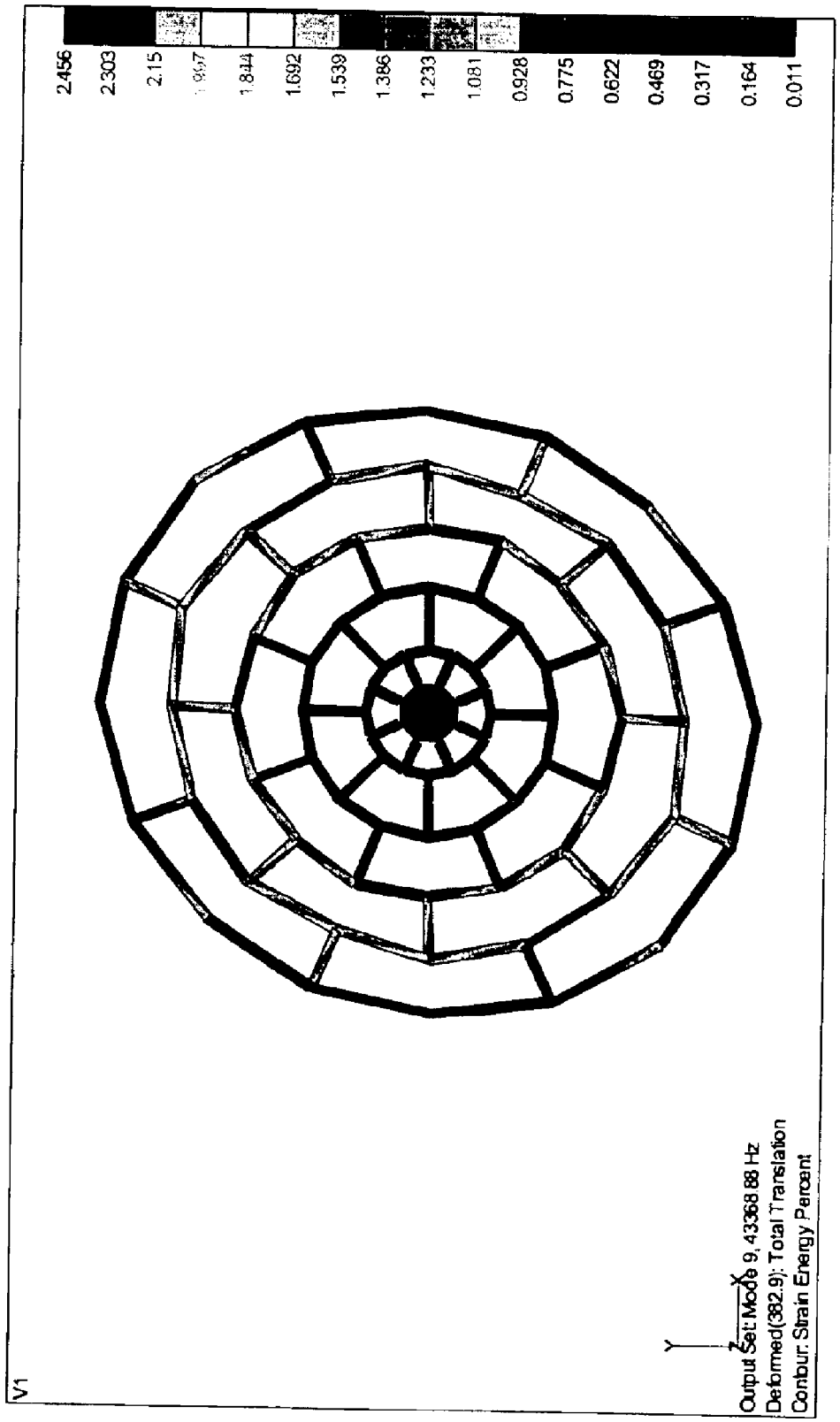
FIGS. 2A–2B represent a finite element model of an exemplary segmented planar resonator gyroscope of the present invention.
Figure 2B:
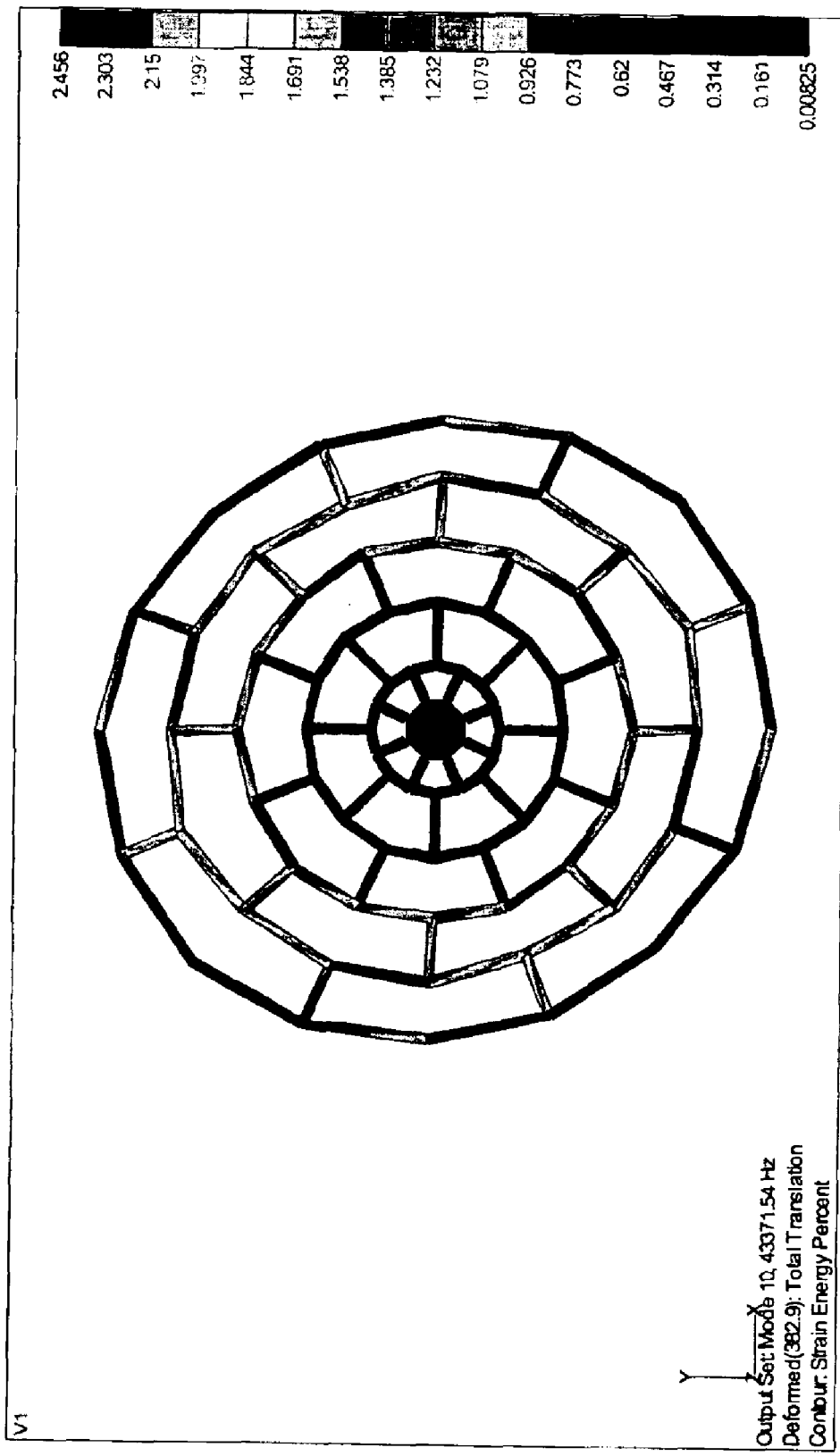
Figure 3A:
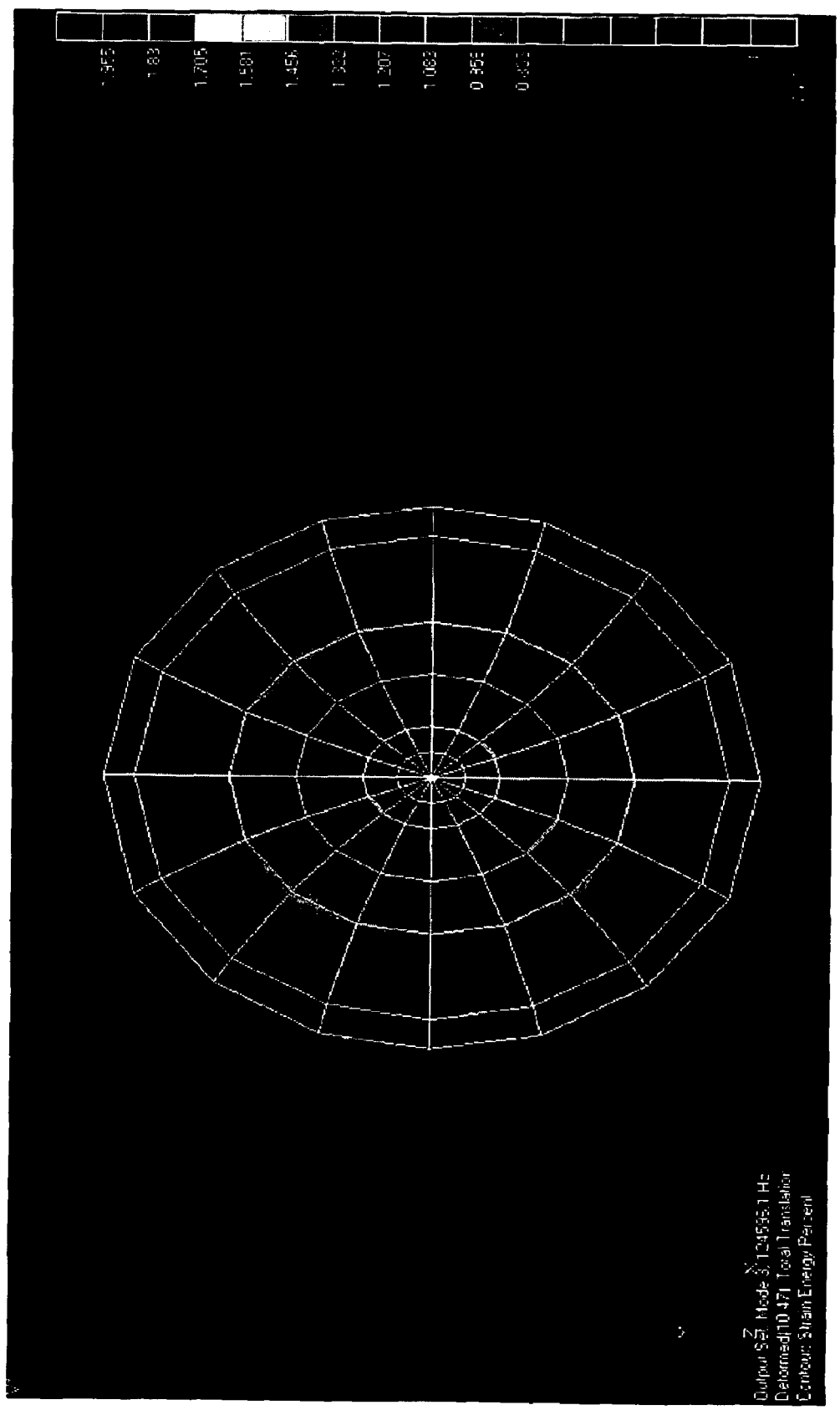
Figure 3B:
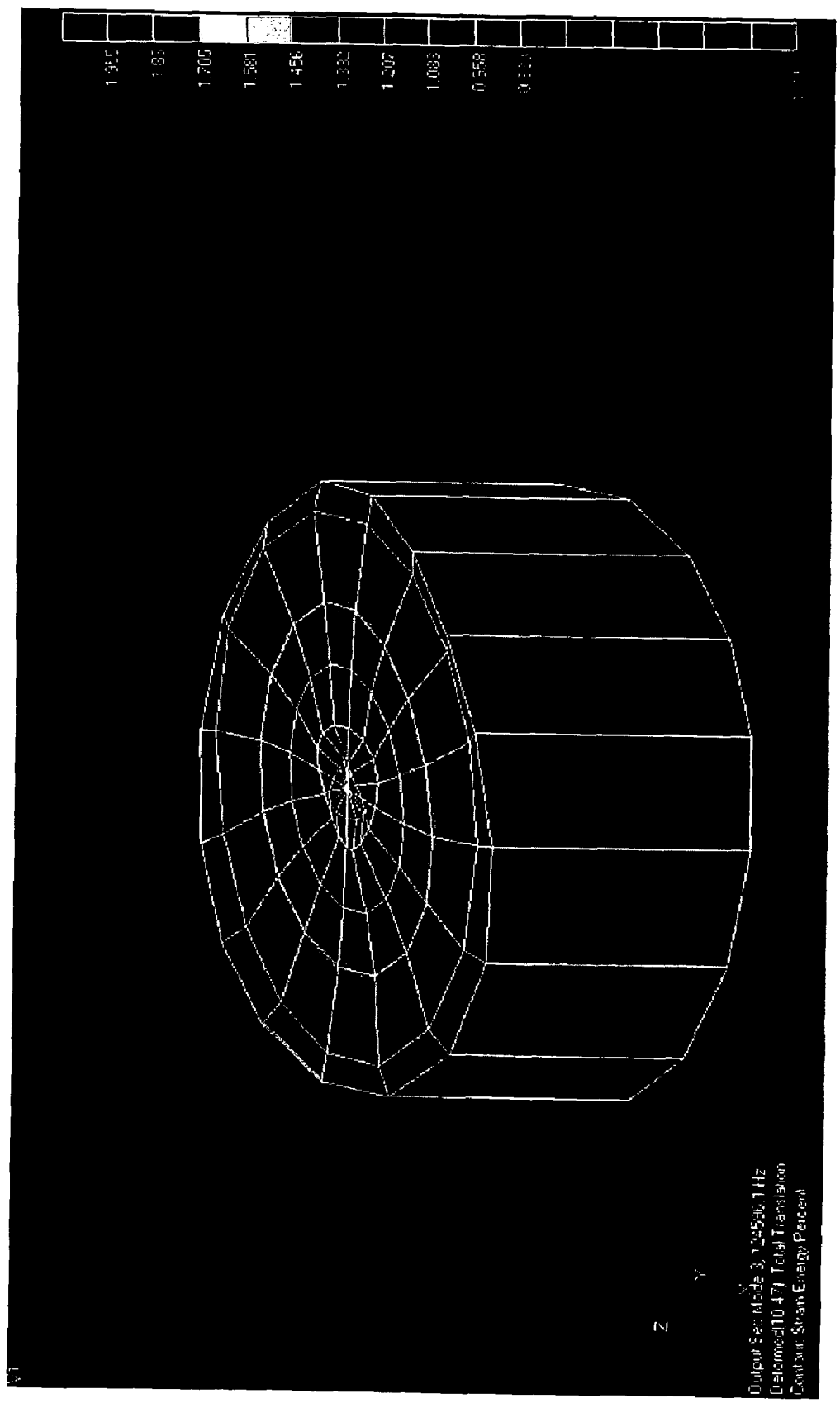
Figure 3C:
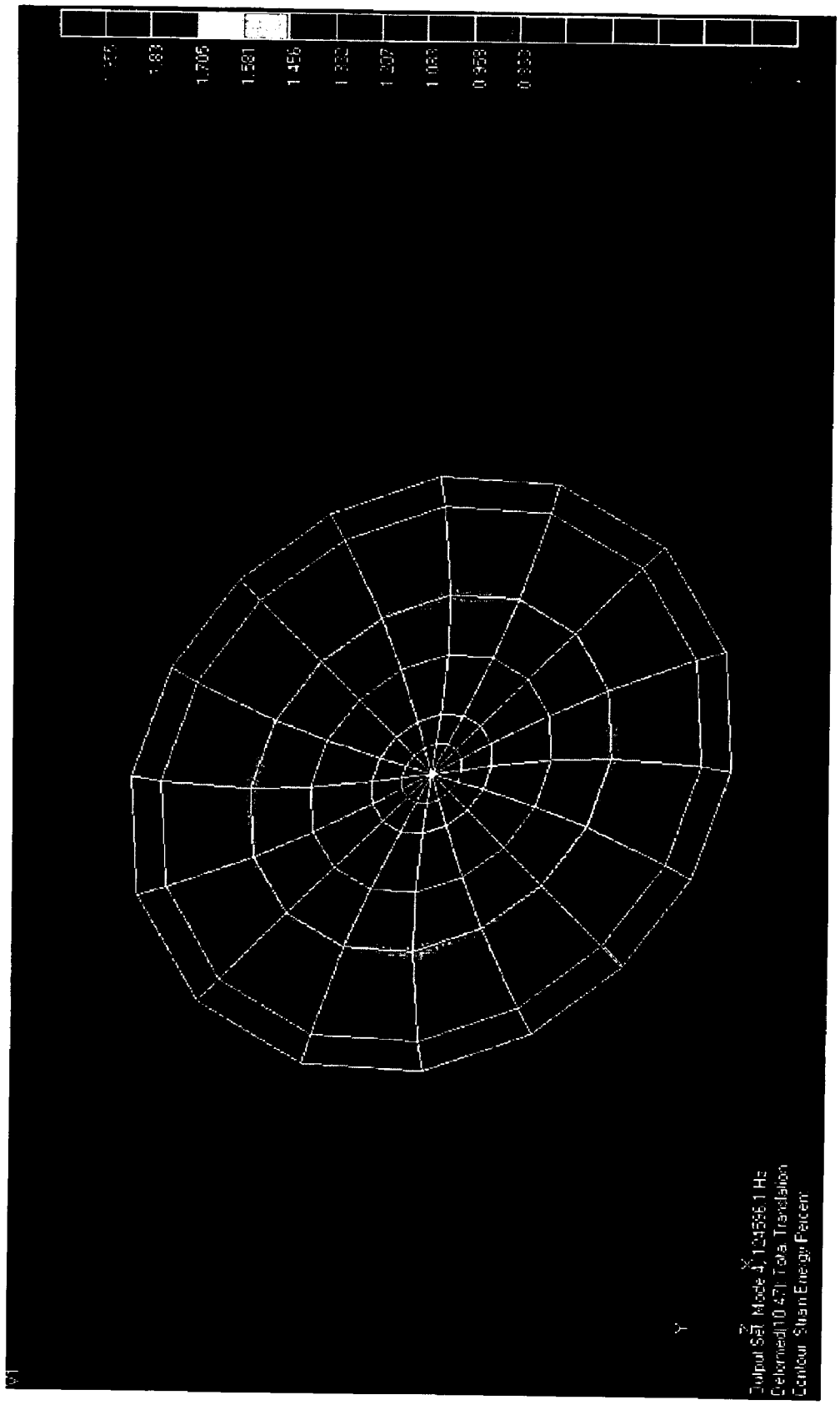
Figure 3D:
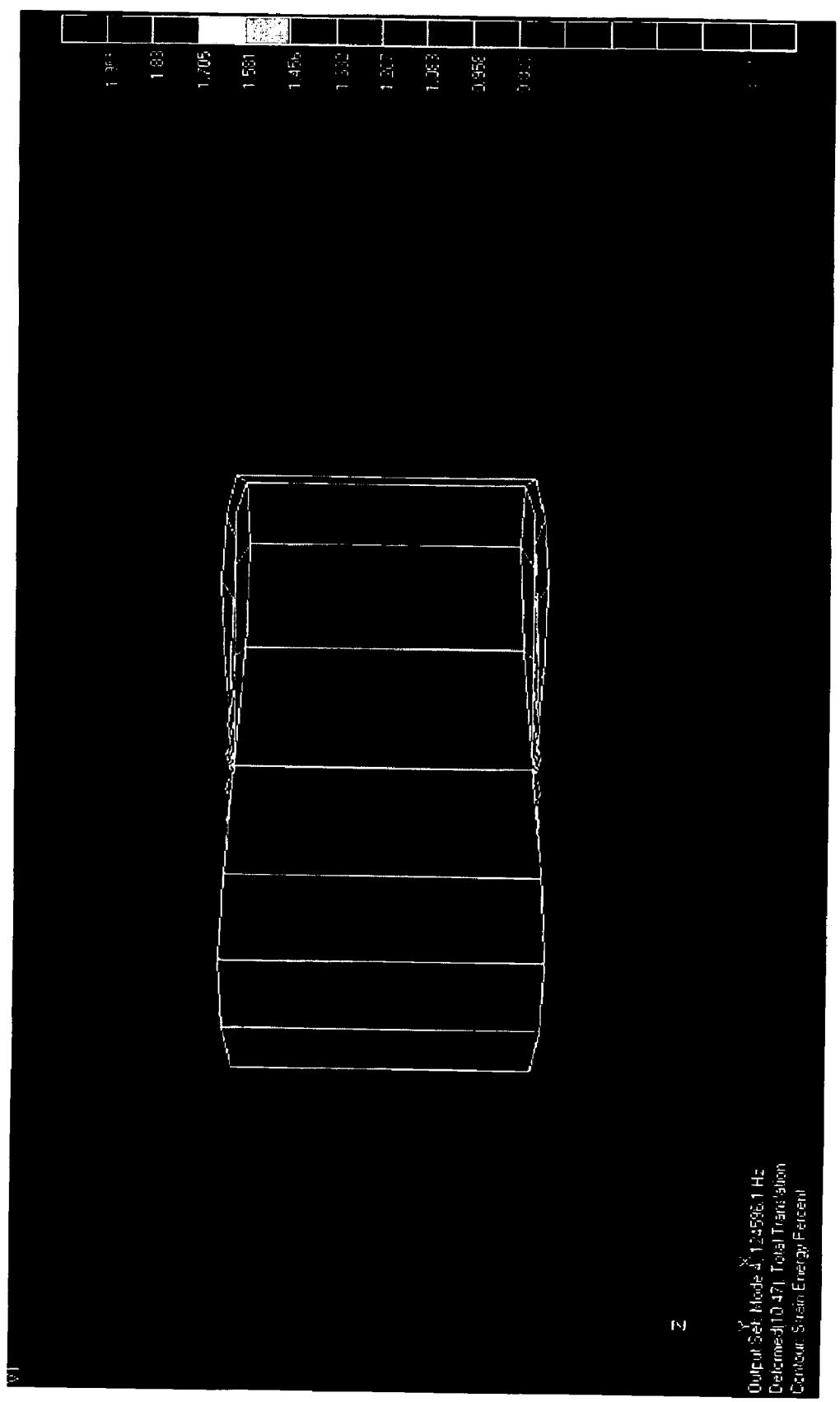
Figure 3E:
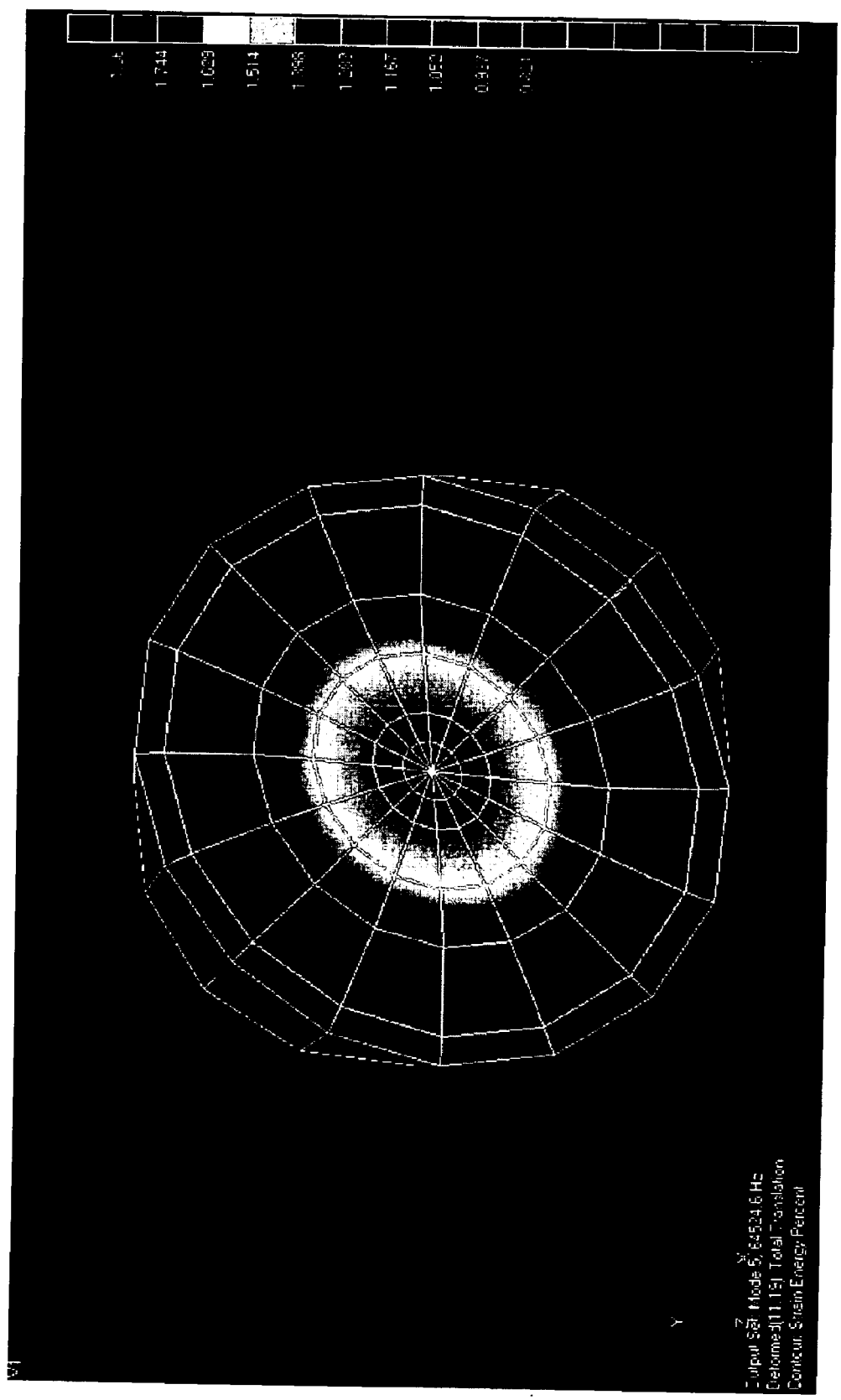
Figure 3F:
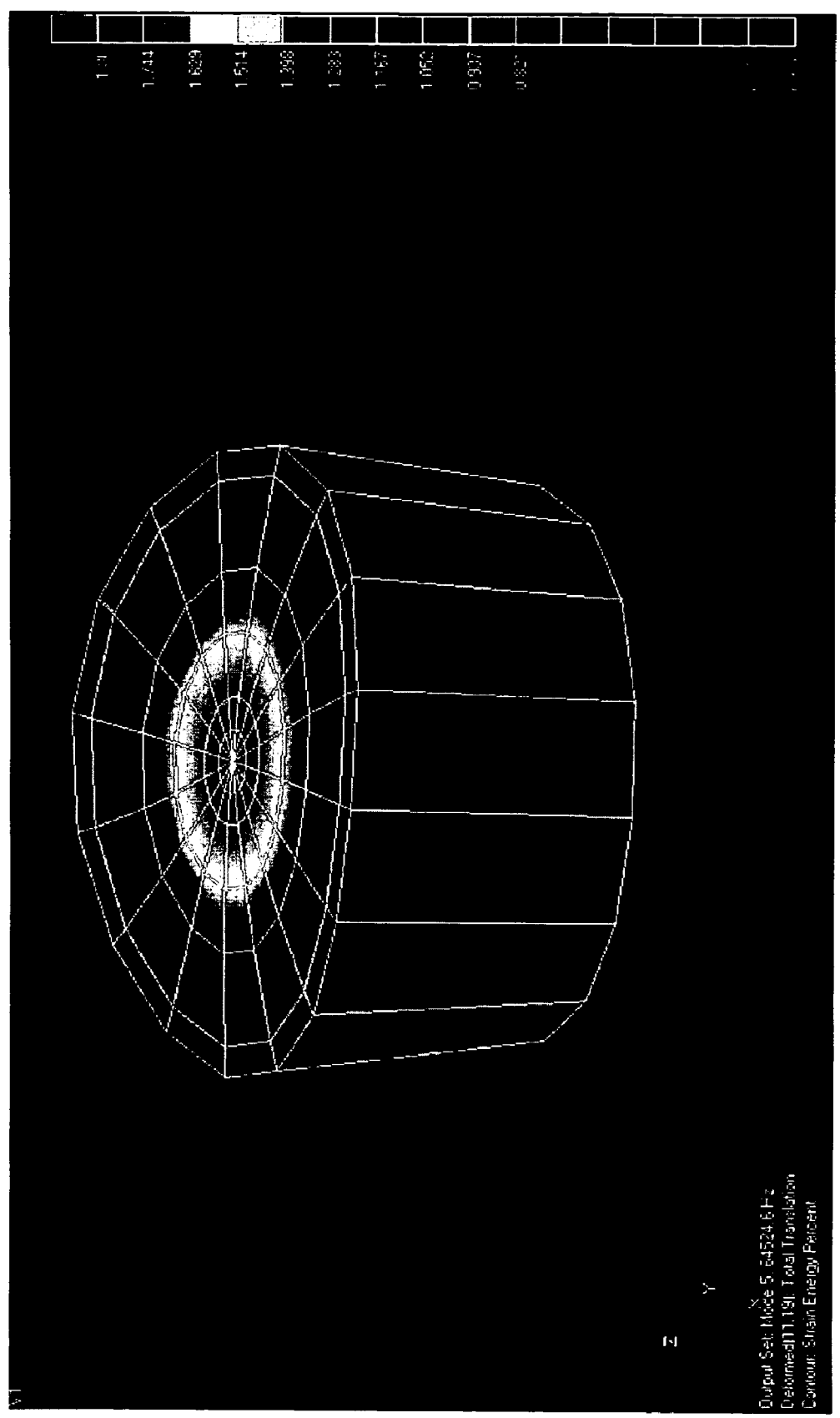
Figure 3G:
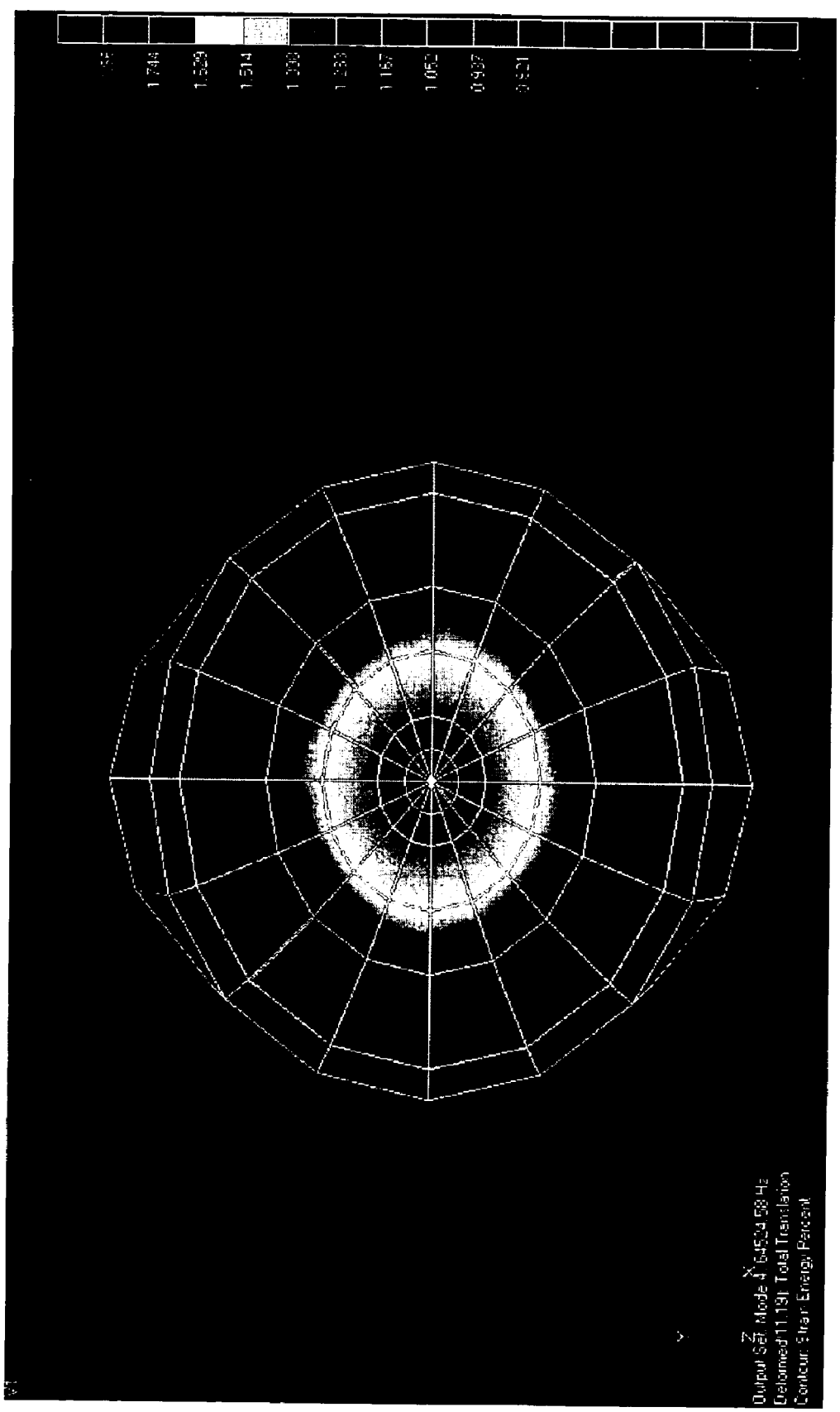
Figure 3H:
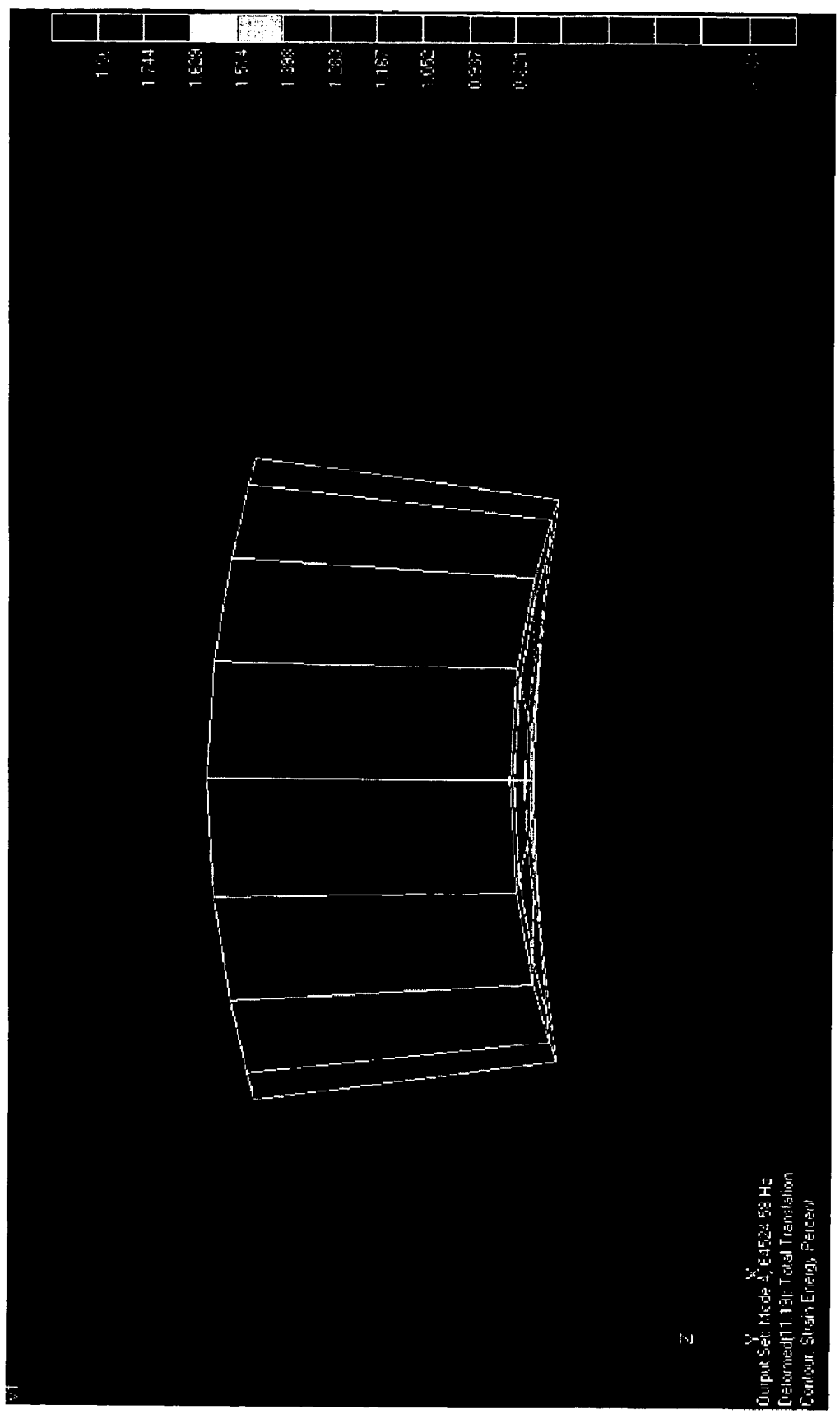
Figure 31:
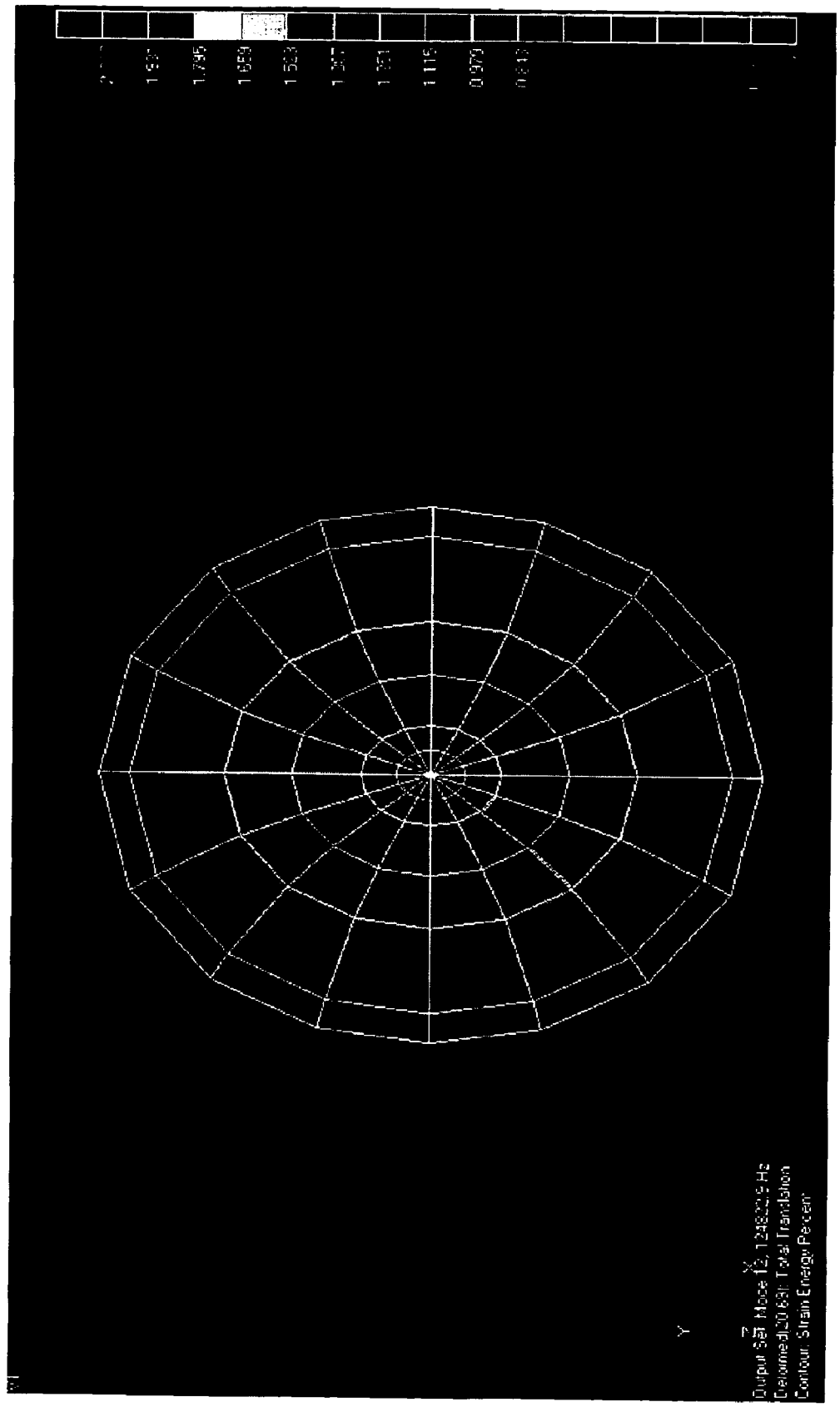
Figure 3J:
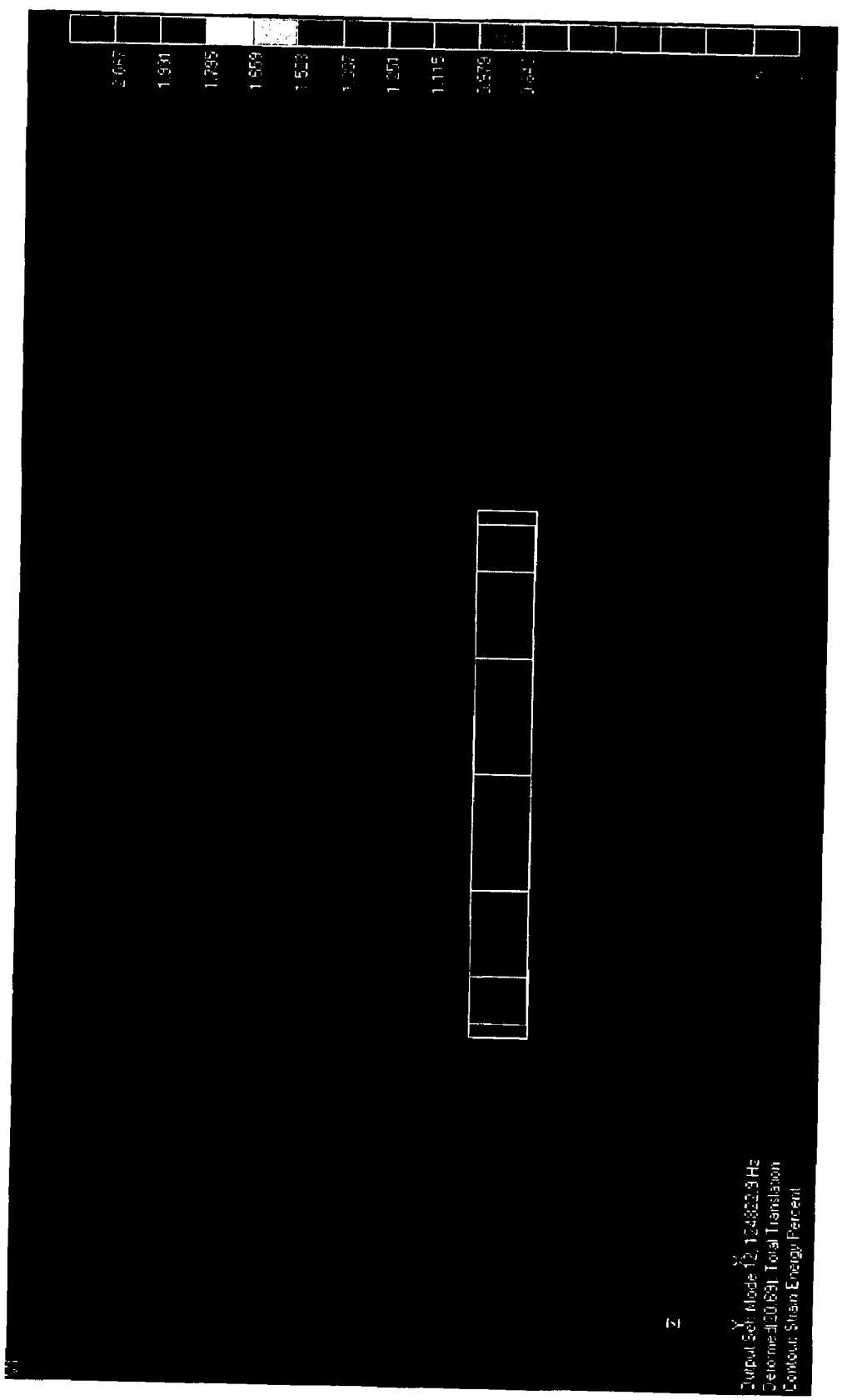

FIGS. 2A and 2B depict a finite element model of an exemplary slotted disc planar resonator gyroscope of the present invention. FIGS. 3A–3J illustrate strain energy within a finite element model of an exemplary cylinder resonator gyroscope in various modes. These various solid cylinder resonator modes illustrate radial strain patterns in a solid cylindrical resonator vibration, aiding in the development of the segmented embodiment of the present invention, such as shown in FIGS. 2A–2B.

Figure 4A:
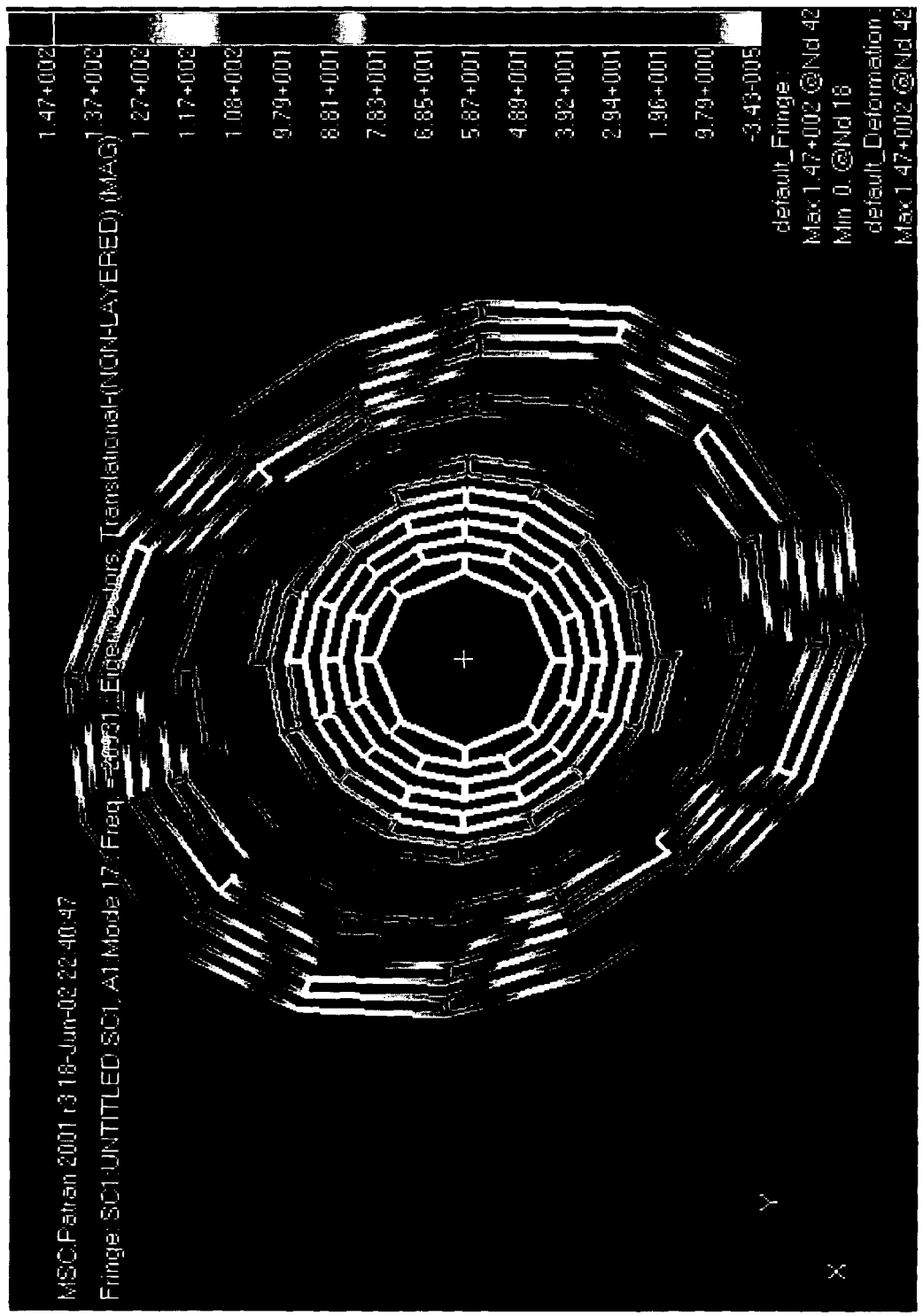
FIGS. 4A and 4B depict another finite element model of an exemplary segmented planar resonator gyroscope of the present invention.
Figure 4B:
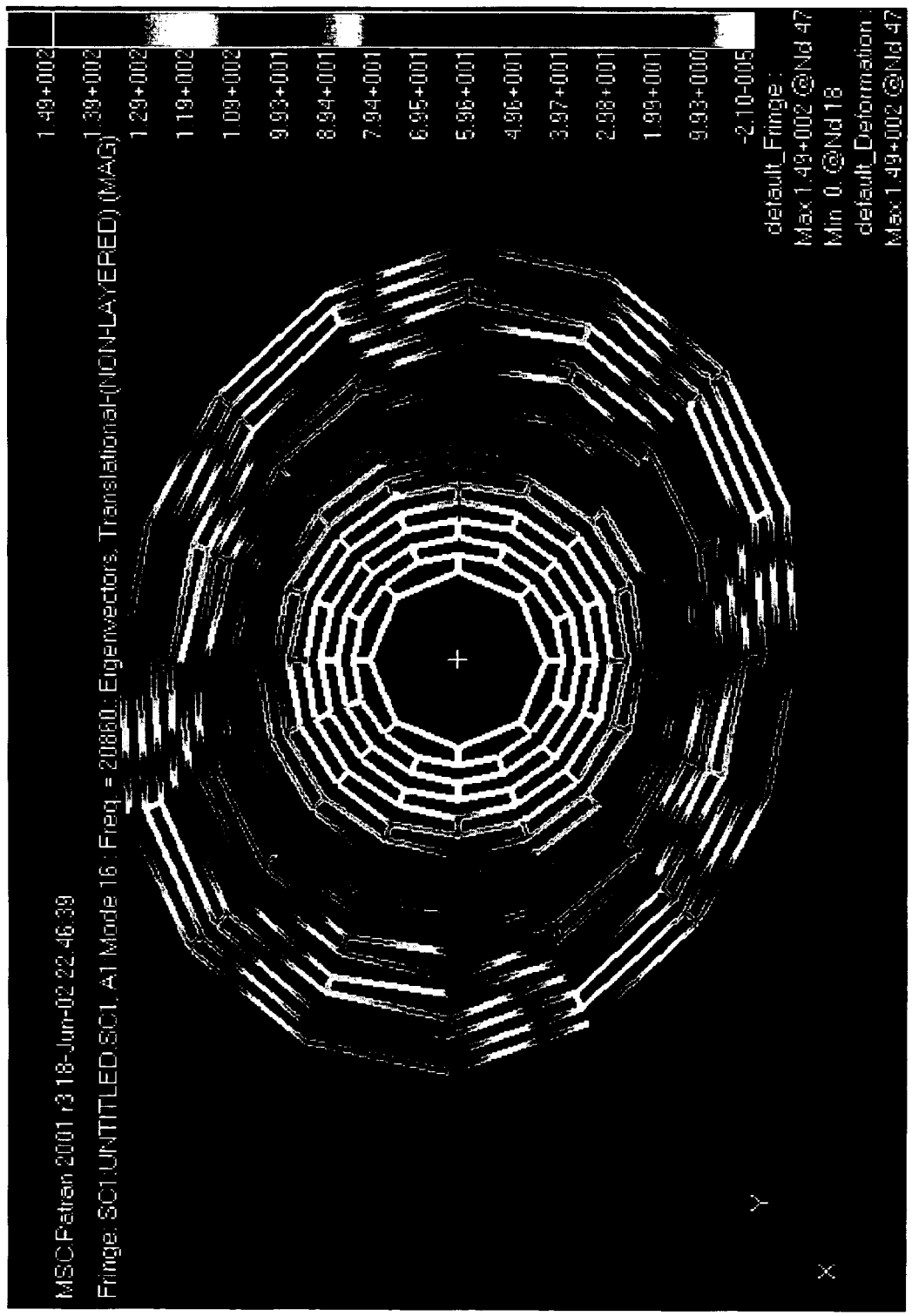

FIGS. 4A and 4B depict another finite element model of an exemplary segmented planar resonator gyroscope of the present invention. The multi-slotted disc Coriolis coupled modes are depicted. Strain contours are shown with a fixed central support in white. In this case, a larger number of segments are employed than in the model of FIGS. 2A and 2B.

4.0 Producing an Isolated Planar Resonator Gyroscope

Figure 5A:
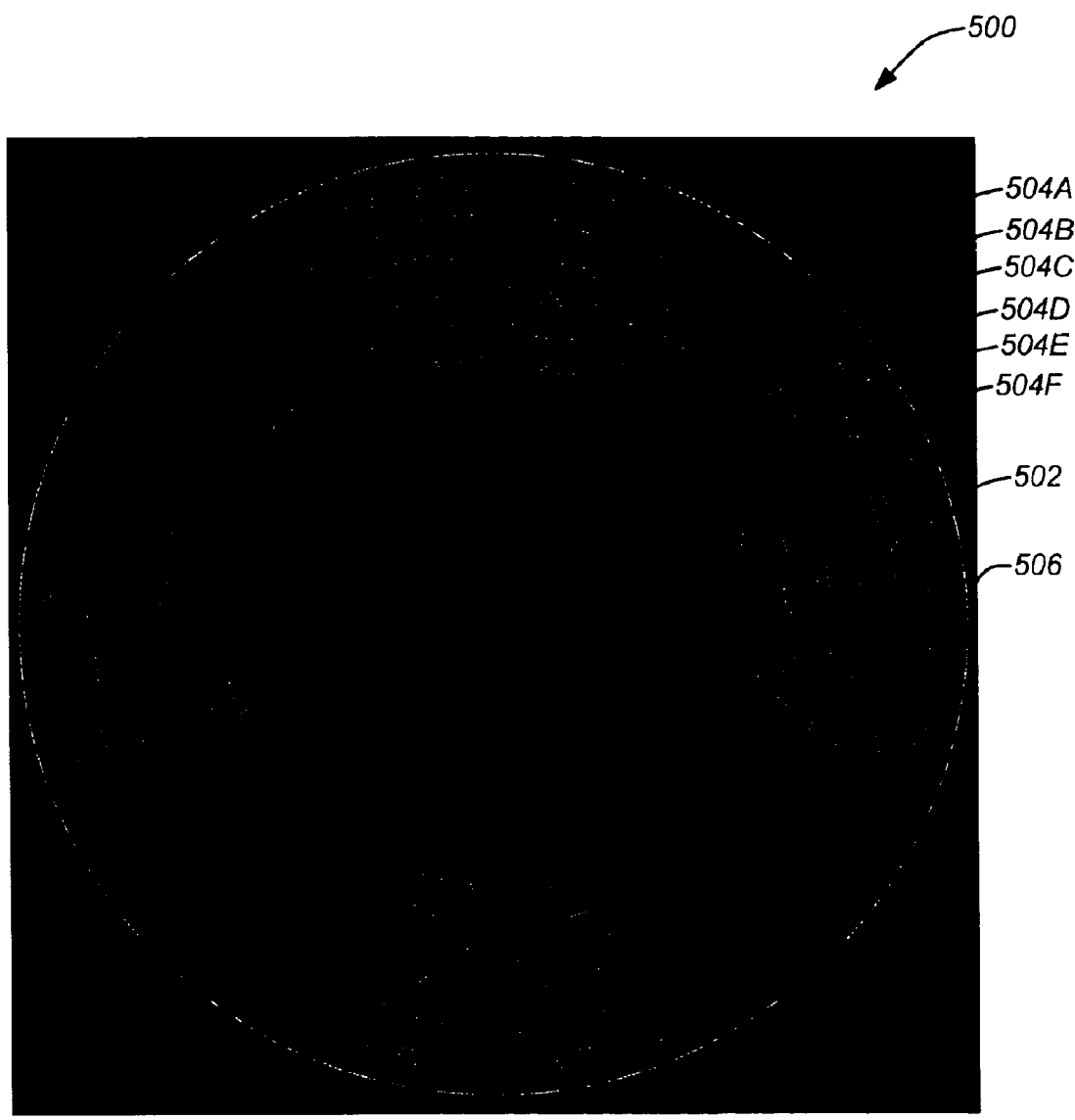
FIGS. 5A–5C illustrate masks that can be used in producing an isolated resonator of the invention.
Figure 5B:
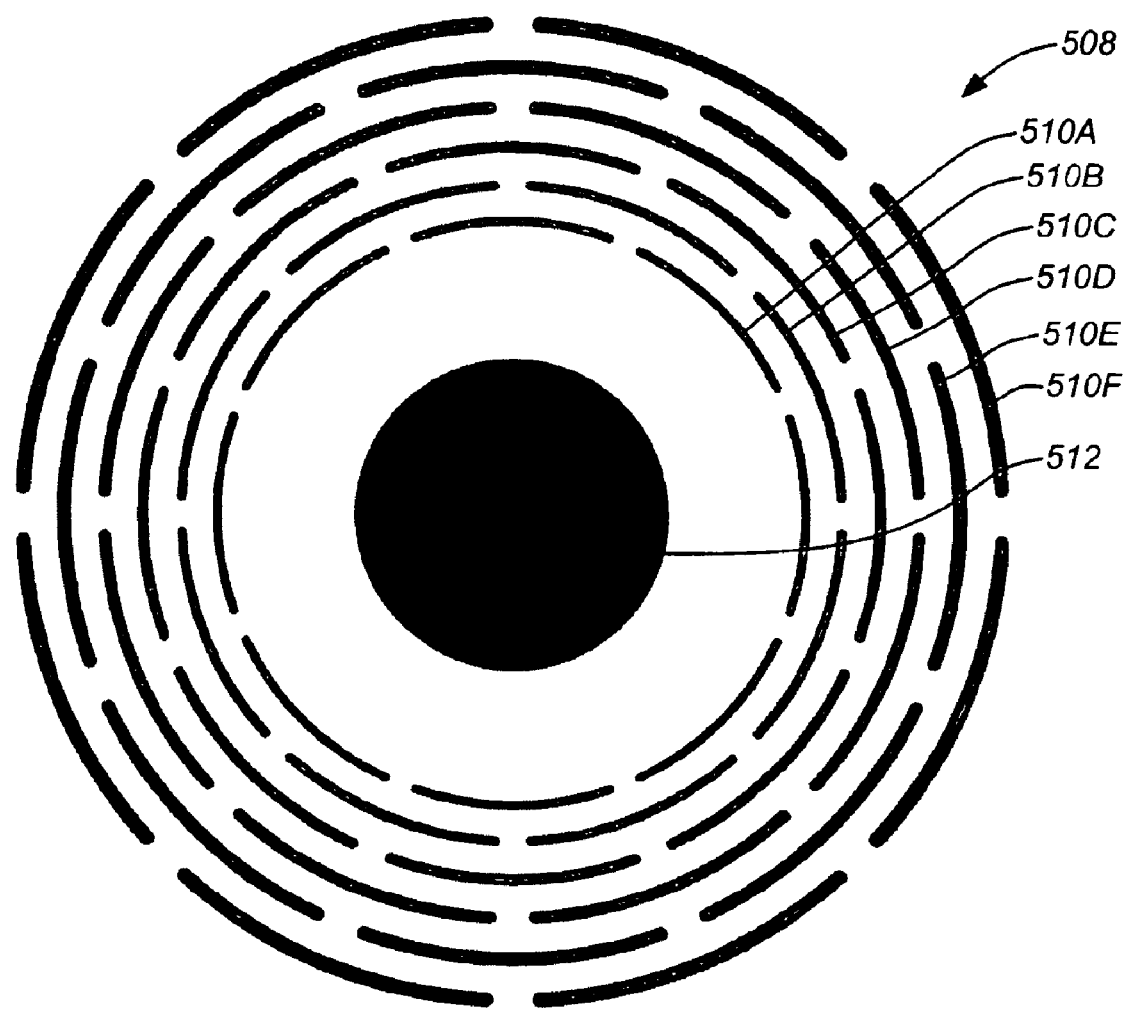
Figure 5C:
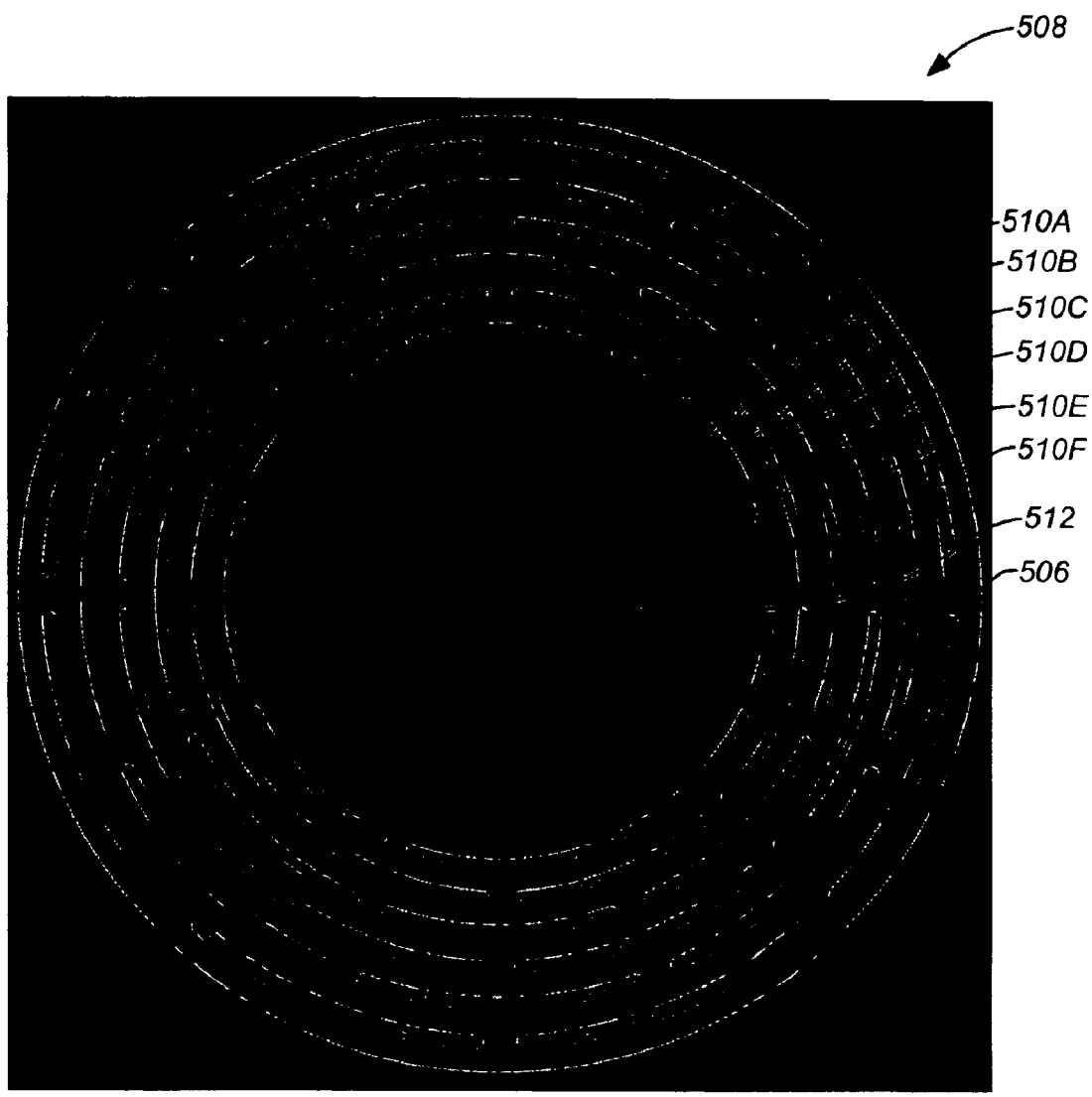

FIGS. 5A–5C illustrate masks that can be used in producing an isolated resonator of the invention. FIG. 5A illustrates a top view of the multi-slotted disc resonator fabrication pattern 500. The resonator pattern includes a large central area 502 which is bonded to the central support on the baseplate. The embedded electrodes, e.g. concentric annular electrodes 504A–504F, are defined by the through etching process that simultaneously defines the structure 506 (radial and circumferential segments) of the resonator. FIG. 5B illustrates a top view of the multi-slotted disc baseplate pattern 508 showing the bonding pads, e.g., electrode bonding pads 510A–510F and the central support bonding pad 512. FIG. 5C illustrates a top view of the multi-slotted disc resonator bonded to the baseplate. To illustrate the alignment, the electrode bonding pads 510A–510F and central support bonding pad 512 are shown through the electrodes and resonator structure 506, respectively. Known silicon manufacturing processes can be employed.

For a mesoscale (16 mm) gyroscope, a 500 micron wafer, e.g. silicon, can be through-etched with circumferential slot segments to define a planar cylindrical resonator with embedded electrostatic sensors and actuators. Integral capacitive electrodes can be formed within these slots from the original resonator silicon during the through etch process. This can be accomplished by first bonding the unmachined resonator disc to a base silicon wafer that is specially prepared with circumferential bonding pillar segments to support the stationary electrodes and central resonator. The pillar heights may be defined by wet chemical etching and gold compression or gold-silicon eutectic bonding can be used to bond the resonator to the support pillars before the resonator and its electrodes are photolithographically machined using deep reactive ion etching (DRIE). In addition, for a microscale (4 mm) resonator a 100 micron thick silicon wafer or silicon on insulator (SOI) or epitaxial silicon layer is required for the resonator wafer. Alternatively, a thicker wafer can be bonded to the baseplate and ground down and polished to the desired thickness. The dense wiring can be photographed onto the baseplate before resonator bonding and wirebonded outside the device to a wiring interconnect grid on a ceramic substrate in conventional vacuum packaging or interconnected to a readout electronics wafer via vertical pins etched into the resonator for a fully integrated silicon gyroscope that does not require a package.

Figure 6A:
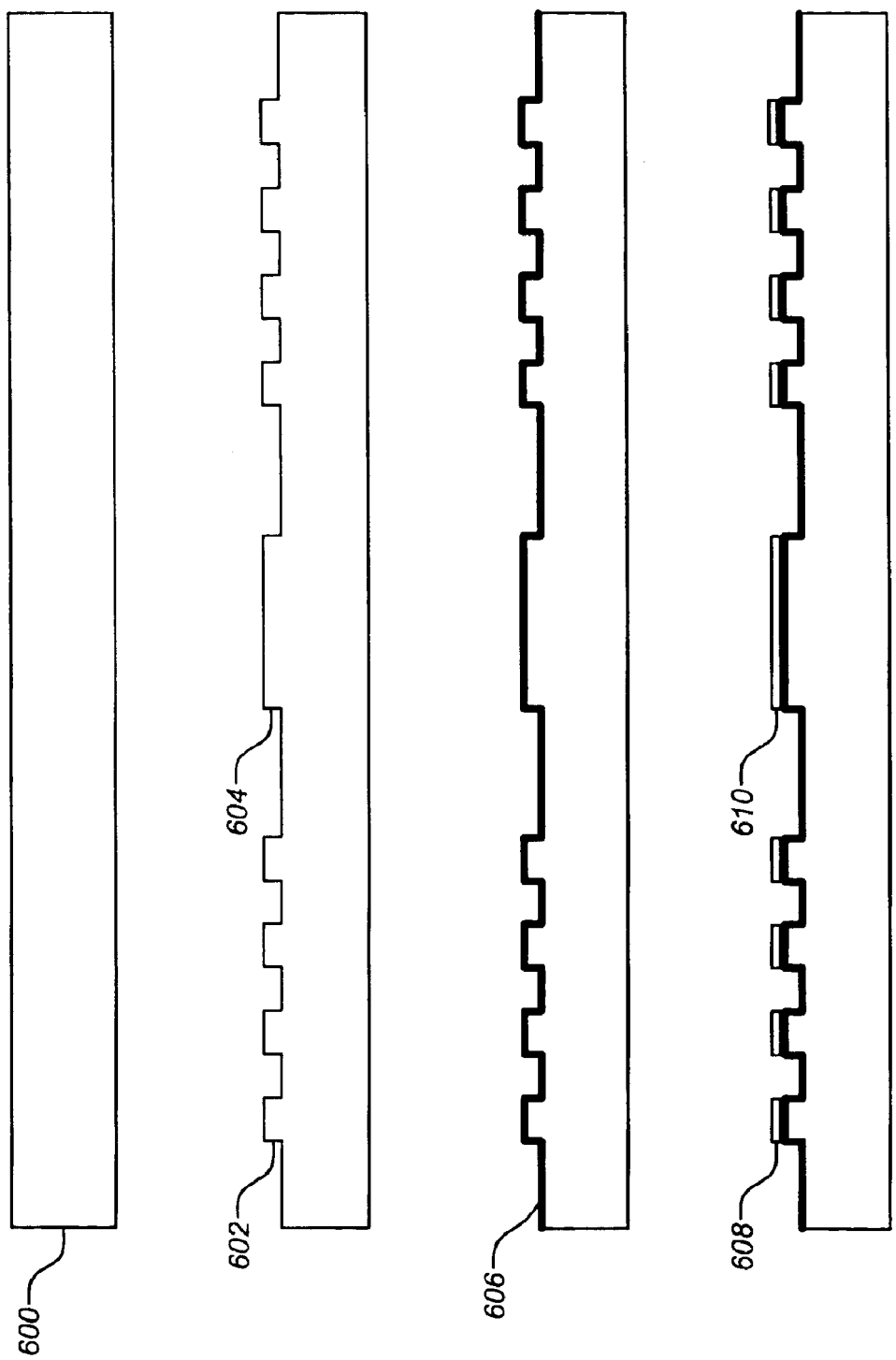
Figure 6C:
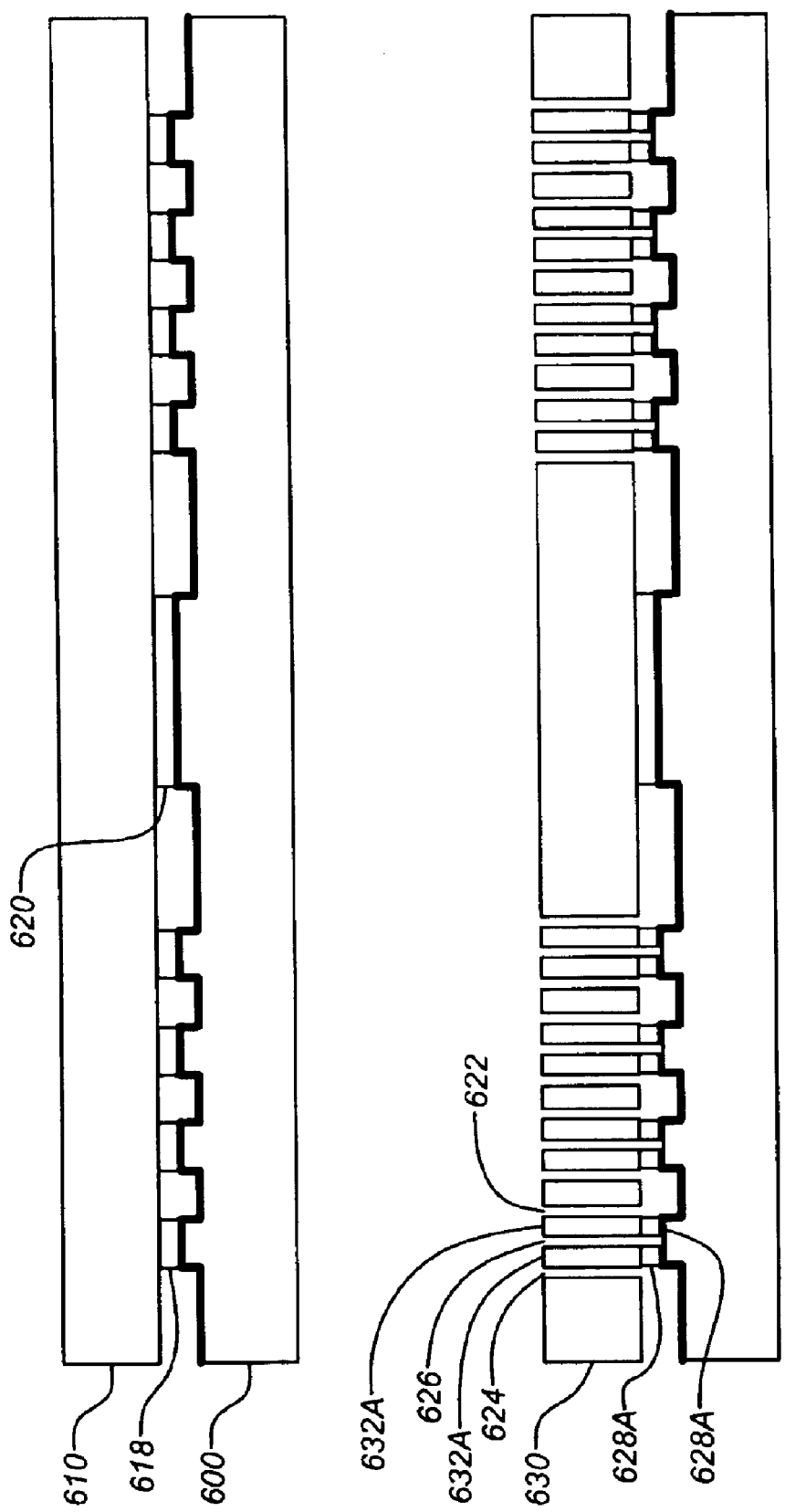

FIGS. 6A–6C depicts various stages of an exemplary manufacturing process for the invention. FIG. 6A shows a sequential development of the baseplate for the resonator gyroscope. The process begins with a wafer 600, e.g. a 500 micron silicon wafer as shown in the first image. The wafer 600 is first etched to produce electrode pillars 602 as well as a central resonator support pillar 604, such as for a single central support as shown in the second image. The etching process can include growing a wet oxide, e.g. silicon oxide, approximately 1500 Angstroms thick, followed by pillar mask lithography according to standard techniques (e.g. using an AZ 5214 resist) known in the art. This is followed by a buffered oxide etch (BOE) of the mask, such as with a Surface Technology Systems (STS) to a depth of approximately 20 microns (corresponding to approximately 5 to 6 minutes). The resist is then removed, using an $O_2$ ashing process for example. Next, the wafer 600 is BOE dipped for approximately 10 to 20 seconds to remove the native oxide. Following this is a potassium hydroxide (KOH) dip of approximately 1 minute at 90° C. The oxide is then removed with HF. The third image of FIG. 6A shows an oxide layer 606 applied over the etched wafer 600. This layer 606 can be applied by growing a wet oxide for approximately 3 days at approximately 1050° C. The oxide layer 606 can then be etched, e.g. using a AZ 5740 resist, BOE oxide etch for approximately 2 hours to get through approximately 5 microns of oxide. After removing the resist, a metalization layer is then applied to form bonding pads 608, 610 on each of the pillars 602, 604, respectively, as shown in the fourth image of FIG. 6A. Application of the metalization layer can be accomplished by mask lithography, depositing the mask (e.g. AZ 5214 at 2000 RPM for 20 seconds). The metal, e.g. 100 Angstroms Ti, 200 Angstroms Pt and 3500 Angstroms Au, is then deposited and the mask is lifted off to yield metal bonding pads 608, 610 only on the surfaces of the pillars 602, 604. Finally, the processed wafer 600 is washed thoroughly with an $O_2$ ashing process prior to bonding with the resonator wafer.

Application of the metalization layer for the bonding pads can also include patterning of the electrical wiring from the electrodes photographed onto the baseplate, wirebonded outside the device to a wiring interconnect grid on a ceramic. Alternately, in further novel embodiments discussed hereafter, the electrical wiring can be alternately developed into an integral vacuum housing produced simultaneously with the resonator.

FIG. 6B shows a sequential development of the resonator wafer for the gyroscope. The first image shows the uniform thickness wafer 612, e.g. of silicon, used to form the resonator. The wafer 612 can first have the back side processed to produce alignment marks with mask lithography applying a resist. The alignment marks can be produce through a reactive ion etch (RIE) process using $CF_4$ and $O_2$ until a relief is clearly visible (approximately 5 to 10 minutes). Alternately, an STS process for approximately 1 minute can also be used. After removing the resist, metalization lithography used to apply a mask to the front side of the wafer 612 to produce bonding pads 614, 616. The metal, e.g. 30 Angstroms Cr and 3500 Angstroms Au or 100 Angstroms Ti, 200 Angstroms Pt and 3500 Angstroms Au, is applied and the mask is lifted off to reveal the bonding pads 614, 616.

FIG. 6C shows integration of the resonator and baseplate wafers and formation of the functional resonator for the gyroscope. The preprocessed baseplate wafer 600 and resonator wafer 612 are bonded together as shown in the first image of FIG. 6C after aligning the two wafers 600, 612 to approximately 1 micron. Bonding fuses the metal bonding pads (the electrode pads 608, 610 as well as the central support bonding pads 614 and 616) to form single bonded metal joints 618 and can be performed at approximately 400° C. and 5000 N. Next, the complete resonator 630 and electrodes 632A, 632B (generally referenced as 632) are simultaneously formed directly from the bonded structure by through etching. The through etching process can be performed using deep reactive ion etch (RIE) such as a suitable STS process with a photolithographically defined mask, e.g. an AZ 5740 mask, approximately 6 to 8 microns thick. The mask can be made as thin as possible for through etching. The resonator wafer 612 is then through etched over the mask pattern to simultaneously produce the resonator 630 as well as the separate electrodes 632A, 632B from the original wafer 612. See also FIGS. 5A–5C. Note that single electrodes 632 can be formed by through etching, forming passages 622, 624, to isolate a section of the resonator wafer 612 attached to a bonded joint 618. In addition, as discussed above with respect to FIG. 1B, electrodes can also be divided into multiple separate elements. For example, through etching an additional passage 626 separates the electrode 632 into two isolated electrode elements 632A, 632B. In this case the passage 626 must penetrate the metal bonded joint 618 to isolate the separate electrode elements 632A, 632B. At the conclusion of the through etching process, the resonator 630 structure is only supported at the central resonator support pillar 604.

Figure 6D:
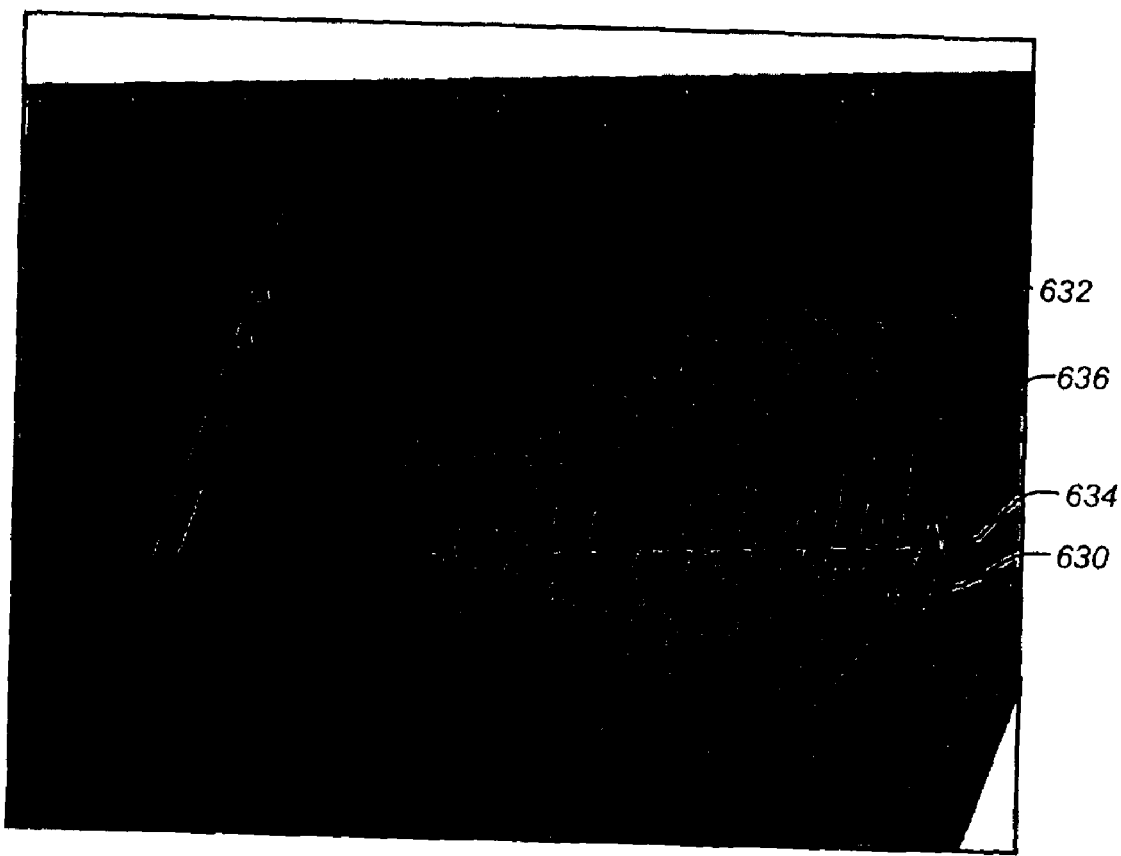
FIG. 6D shows an exemplary resonator with a quarter cutaway to reveal the embedded electrodes.

FIG. 6D shows an exemplary resonator 630 with a quarter cutaway to reveal the embedded electrodes 632. A dust ring 634 is also shown that can be etched along with the resonator 630. Intermittent gaps 636 in the dust ring can be made to accommodate metal traces to the electrodes 632 to operate the gyro.

Elements of the exemplary planar silicon resonator gyro embodiments presented herein can be assembled with conventional vacuum packaging and discrete electronics in a manner similar to previous gyros. An internal ceramic substrate wiring bonded to the silicon gyro baseplate can be changed to match the new and old designs to existing packages.

Figure 6E:
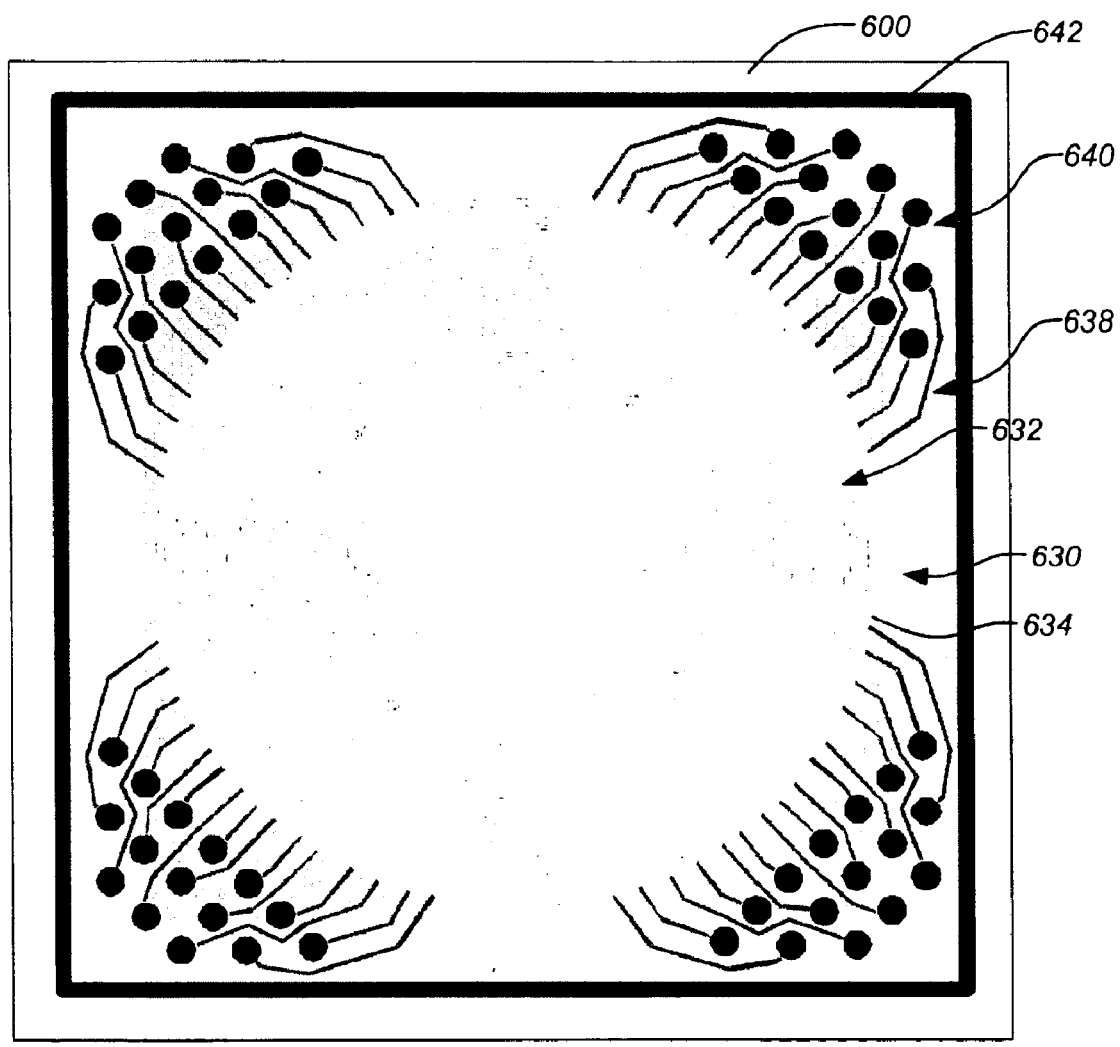
FIG. 6E shows an exemplary gyro without end cap readout electronics assembled

FIG. 6E shows an exemplary gyro in a typical packaging assembly. Metal traces 638 from the electrodes 632 of the resonator 630. The dust ring 634 with intermittent gaps 636 allows passage of the metal traces 638 on the baseplate wafer 600 to the electrodes 632. The metal traces 638 lead to vertical connect pins 640 which pass through the baseplate wafer 600 (providing a vacuum seal). In the exemplary architecture shown, the vertical connect pins 640 are disposed in the corners of the square baseplate wafer 600. A vacuum cavity wall 642 surrounds the entire assembly. The vacuum cavity wall 642 can be applied as a part of a conventional housing covering the resonator 630 and bonded to the baseplate wafer 600. Alternately, in further embodiments discussed hereafter, an vacuum cavity wall 642 can be produced simultaneously with the resonator.

Figure 7:
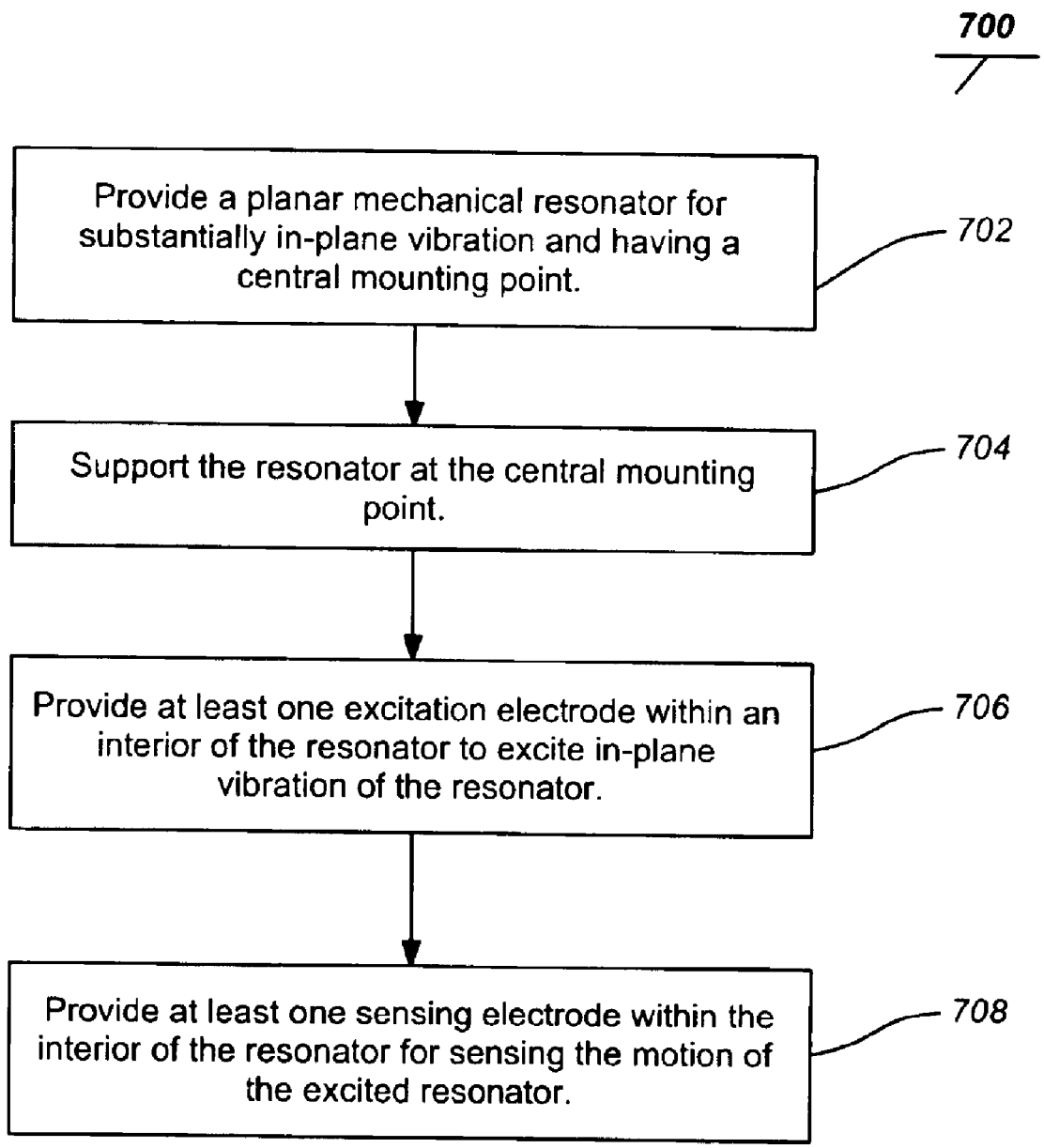
FIG. 7 is a flowchart of an exemplary method of producing a resonator according to the present invention.

FIG. 7 is a flowchart of an exemplary method of producing a resonator according to the present invention. The method 700 includes providing a planar mechanical resonator for substantially in-plane vibration and having a central mounting point at step 702. The resonator is supported at the central mounting point at step 704. At step 706, at least one excitation electrode is provided within an interior of the resonator to excite in-plane vibration of the resonator. Finally at step 708, at least one sensing electrode is provided within the interior of the resonator for sensing the motion of the excited resonator. As discussed above, in further embodiments the planar mechanical resonator can be provided and supported substantially simultaneously with providing the excitation and sensing electrodes by through etching.

Final mechanical trimming with a laser or a focused ion beam (FIB) of all embodiments described herein can be optionally used to achieve full performance over thermal and vibration environments. Such FIB tuning applied to gyro resonators is described in U.S. application Ser. No. 10/285,886 filed Nov. 1, 2002 by Kubena et at, which is incorporated by reference herein, and which issued Mar. 2, 2004 as U.S. Pat. No. 6,698,287.

5.0 Alternate Isolated Planar Resonator Gyroscope

An exemplary centrally supported planar resonator having concentric circumferential slots with internal electrodes to produce substantially in-plane vibration is described above. However, it is important to note that other planar resonator patterns are also possible using the principles and procedures described.

Figure 8:
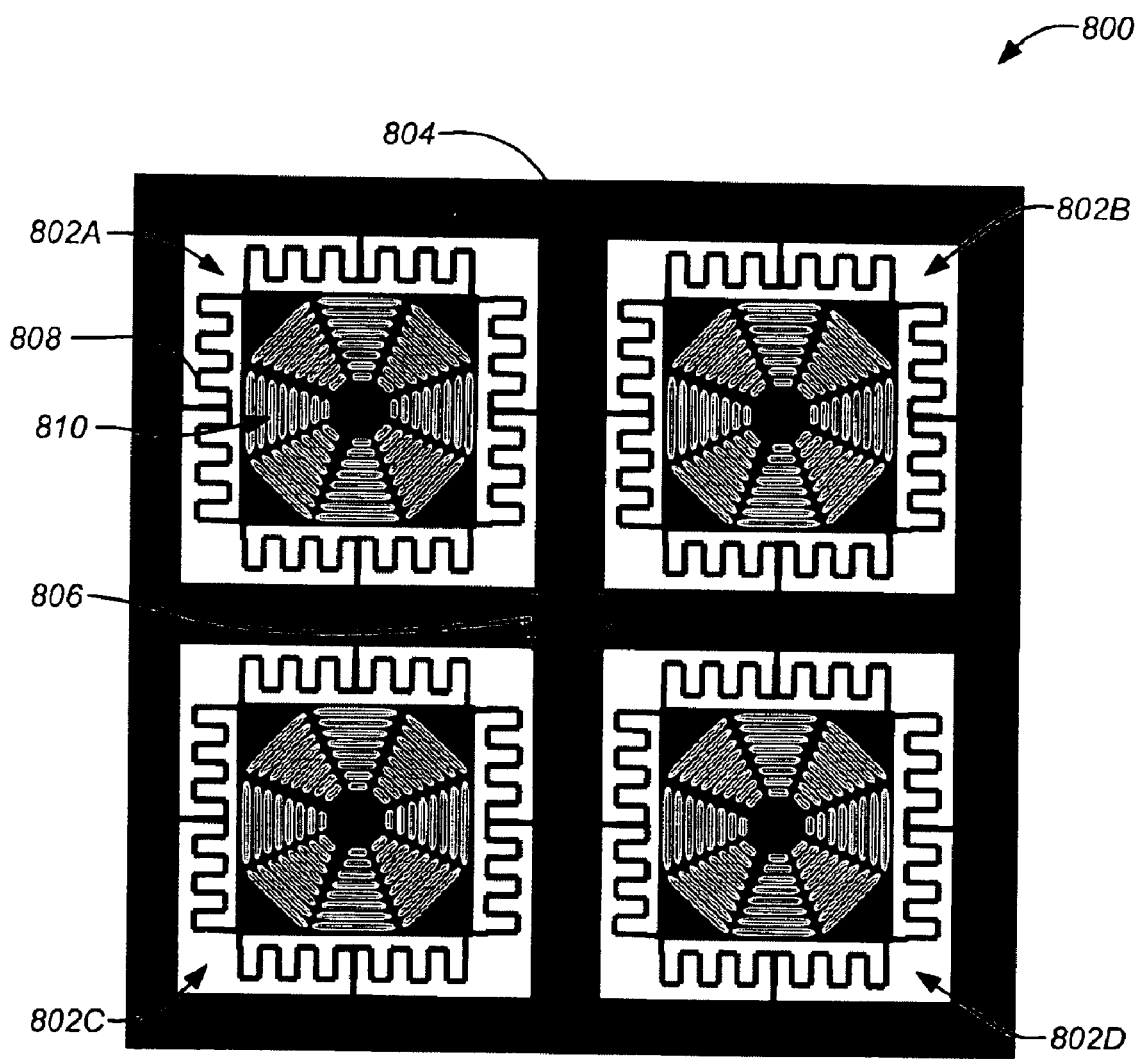
FIG. 8 illustrates an alternate isolated planar resonator gyroscope embodiment comprising four masses vibrating in plane.

FIG. 8 illustrates an alternate isolated planar resonator gyroscope embodiment comprising four masses vibrating in plane. In this embodiment, the resonator 800 comprises a plate including four subresonator mass elements 802A–802D (generally referenced as 802) each occupying a separate pane of a supporting frame 804. The frame is attached to a baseplate (not shown) at a central support 806. Each subresonator mass element 802A–802D, is attached to the frame 804 by one or more support flexures 808. In the exemplary resonator 800, four support flexures 808 each having a meander line shape are attached to each mass element 802A–802D, one attached to each of the four sides of the element 802. Each support flexure 808 is attached to two corners of the mass element 802 at its ends and attached to an adjacent side of the pane of the support frame 804 at its middle. Each mass element 802A–802D includes eight groups of linear electrodes 810 (each electrode including two elements) arranged in a pattern of increasing length from a central point of the mass element 802. Each subresonator mass element 802A–802D has a pair of simple degenerate in-plane vibration modes to yield two degenerate in-plane system modes involving symmetric motion of all four elements 802A–802D, suitable for Coriolis sensing. Note that despite the significant differences in the architecture between this embodiment and that of FIGS. 1A–1B, both still utilize planar mechanical resonators for substantially in-plane vibration with internal excitation and sensing electrodes.

Figure 9A:
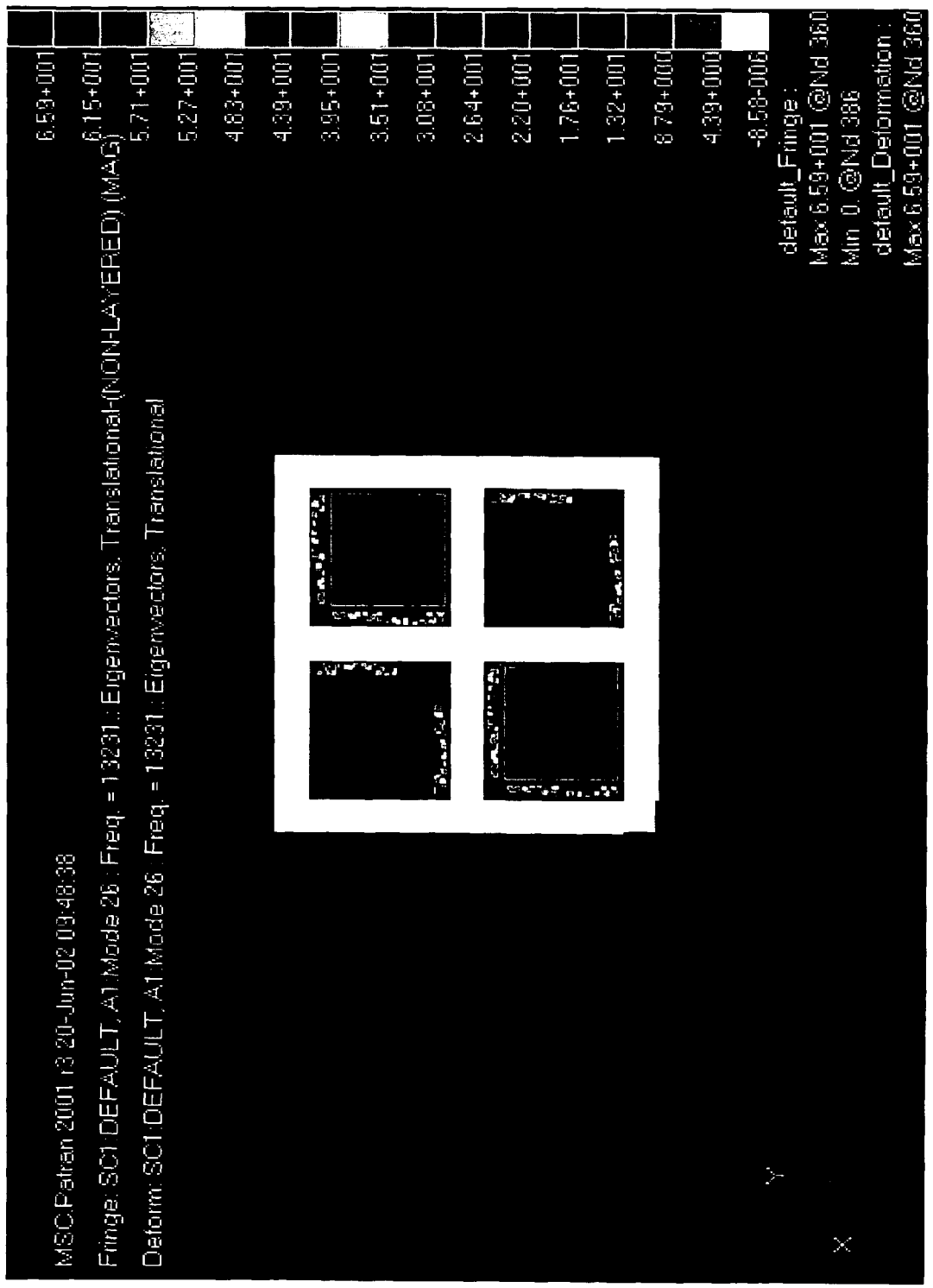
FIGS. 9A and 9B illustrate the Coriolis sensing modes of the four masses vibrating in plane.
Figure 9B:
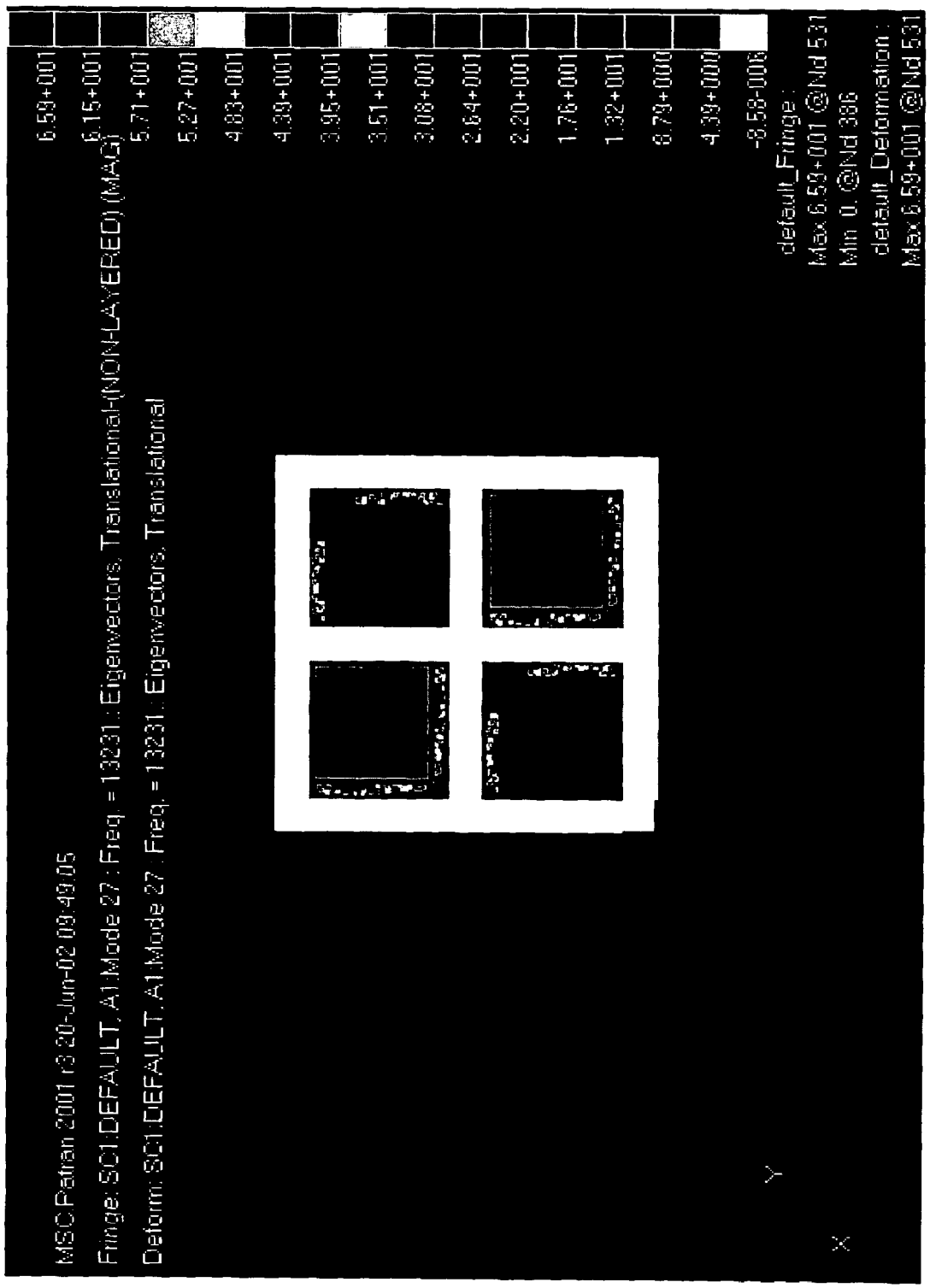

FIGS. 9A and 9B illustrate a model of the Coriolis sensing modes of the four masses vibrating in plane. There are some key advantages of this alternate in-plane design embodiment over other out-of-plane gyros. For example, this embodiment includes a central support 806 bond that carries no vibratory loads, virtually eliminating any possible friction. In addition, simultaneous photolithographic machining of the resonator and electrodes can be achieved via the slots. Further, with this embodiment diametral electrode capacitances can be summed to eliminate vibration rectification and axial vibration does not change capacitance to a first order. The modal symmetry is largely determined by photolithographic symmetry, not wafer thickness as with gyros employing out-of-plane vibration. Also, this embodiment employs isolation and optimization of the sense capacitance (e.g., the outer slots of each element) and the drive capacitance (e.g., the inner slots of each element) and provides a geometrically scalable design to smaller/larger diameters and thinner/thicker wafers. This embodiment can also be entirely defined by slots of the same width for machining uniformity and symmetry. Finally, with this embodiment four-fold symmetry applies to all the Si crystal orientations and an ideal angular gain approaches one.

Wiring can be photographed onto the baseplate and wirebond outside the device to a wiring interconnect grid on a ceramic as discussed above. However, implementation of this alternate embodiment can require many electrodes and interconnect wiring. As discussed below, the electrical wiring for this embodiment can also be alternately developed into an integral vacuum housing produced simultaneously with the resonator. Such an implementation is detailed hereafter.

There is also a potential interaction with degenerate pairs of other system modes very close in frequency. However, these can be ignored if not coupled. In addition, the central support and frame compliance can be modified to shift any coupled modes away in frequency.

This embodiment can also employ final mechanical trimming with laser or FIB of all mesogyro designs can be used to achieve full performance over thermal and vibration environments. This technique is described in U.S. application No. 10/285,886 filed Nov. 1, 2002 by Kubena et al., which is incorporated by reference herein, and which issued Mar. 2, 2004 as U.S. Pat. No. 6,698,287. It is also noted that the isolation of the degenerate modes used in present embodiments of the invention can also be trimmed electrostatically, as with the embodiments discussed above and other out-of-plane gyro designs.

This alternate embodiment can also be packaged using conventional techniques. However, as discussed hereafter, the resonator can also be integrated into a novel integrated vacuum housing formed by resonator baseplate, case wall and readout electronics.

6.0 Isolated Planar Resonator Gyroscope with Integral Case and Readout Electronics In further embodiments of the invention, the isolated planar resonator with internal excitation and sensing electrodes can be produced in a novel gyroscope including integral case. The case can comprise a vacuum housing that is developed along with the resonator. These further embodiments build upon the basic product and manufacturing procedure detailed above with respect to FIGS. 6A–7.

Figure 10A:
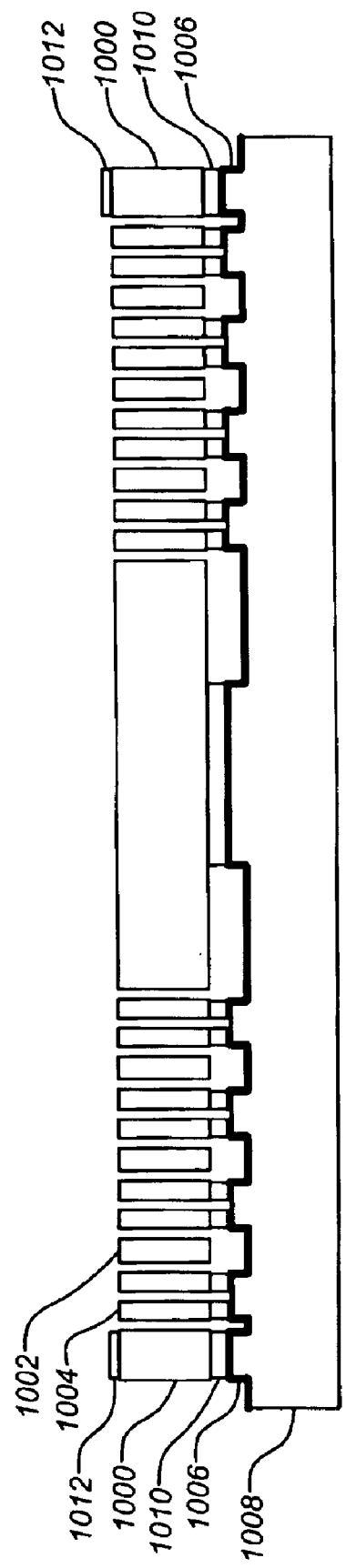
FIGS. 10A–10C illustrate the integration of a end cap wafer with the baseplate including an integral vacuum cavity wall.

FIG. 10A illustrates development of a vacuum cavity wall 1000 along with the resonator 1002 and electrodes 1004. The vacuum cavity wall 1000 is produced by first etching a continuous low wall 1006 on the baseplate 1008 around the perimeter of the electrode pillars as well as a central resonator support pillar. A bonding line 1010 (e.g., Au) is then produced on the low wall 1006 (over the SiO$_2$ layer) along with the bonding pads of the electrodes and central support. The resonator 1002 is prepare with a matching bonding line that is fused to the bonding line 1010. The vacuum cavity wall 1000 is then through etched from the resonator wafer along with the resonator 1002 and the electrodes 1004. Another bonding line 1012 (e.g. Au) is produced on the top surface of the vacuum cavity wall 1000.

Figure 10B:

FIG. 10B illustrates development of an end cap wafer 1014 that can be used to vacuum seal a resonator 1002. Like the baseplate 1008 of FIG. 10A, the end cap wafer 1014 is etched with a continuous low wall 1016. A metal bonding line 1018 (e.g., Au) is also produced over the oxide layer on the end cap wafer 1014.

Figure 10C:
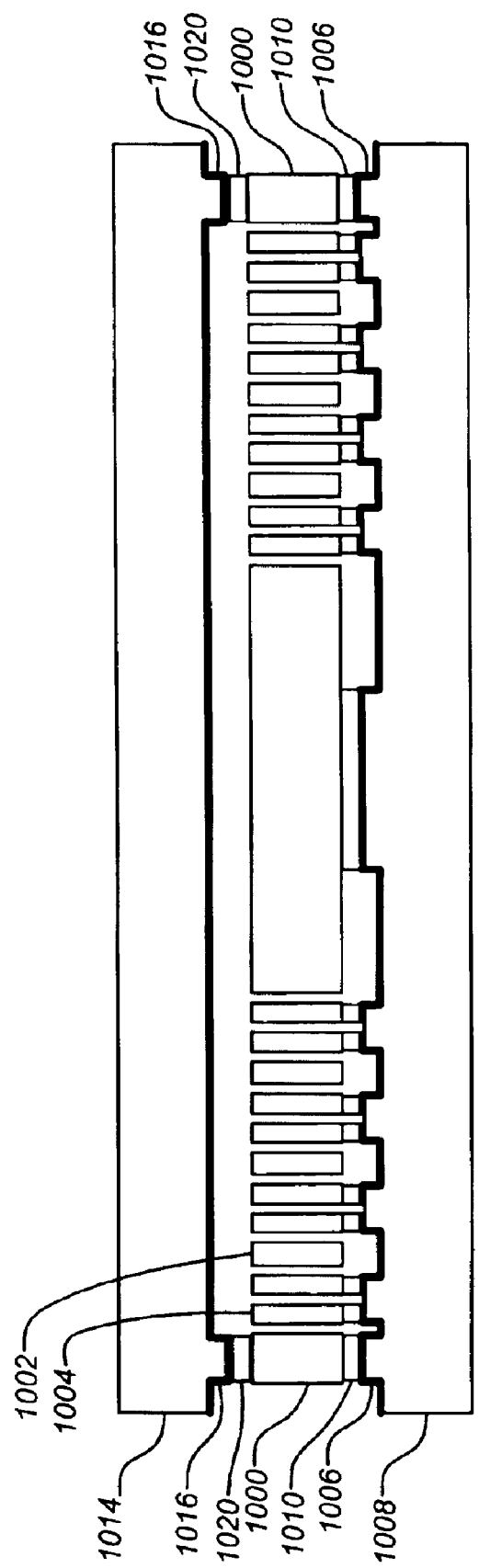

FIG. 10C illustrates the integration of the end cap wafer 1014 with the baseplate including the vacuum cavity wall 1000. The bonding line 1010 of the vacuum cavity wall 1000 and the bonding line 1018 of the end cap wafer 1014 are then fused to form a vacuum seal 1020. The development of the vacuum cavity wall 1000 along with the planar resonator eliminates the need for separate hardware packaging procedures and costs. In further embodiments, this aspect of the present invention further integrates the device and packaging solution.

Figure 10D:
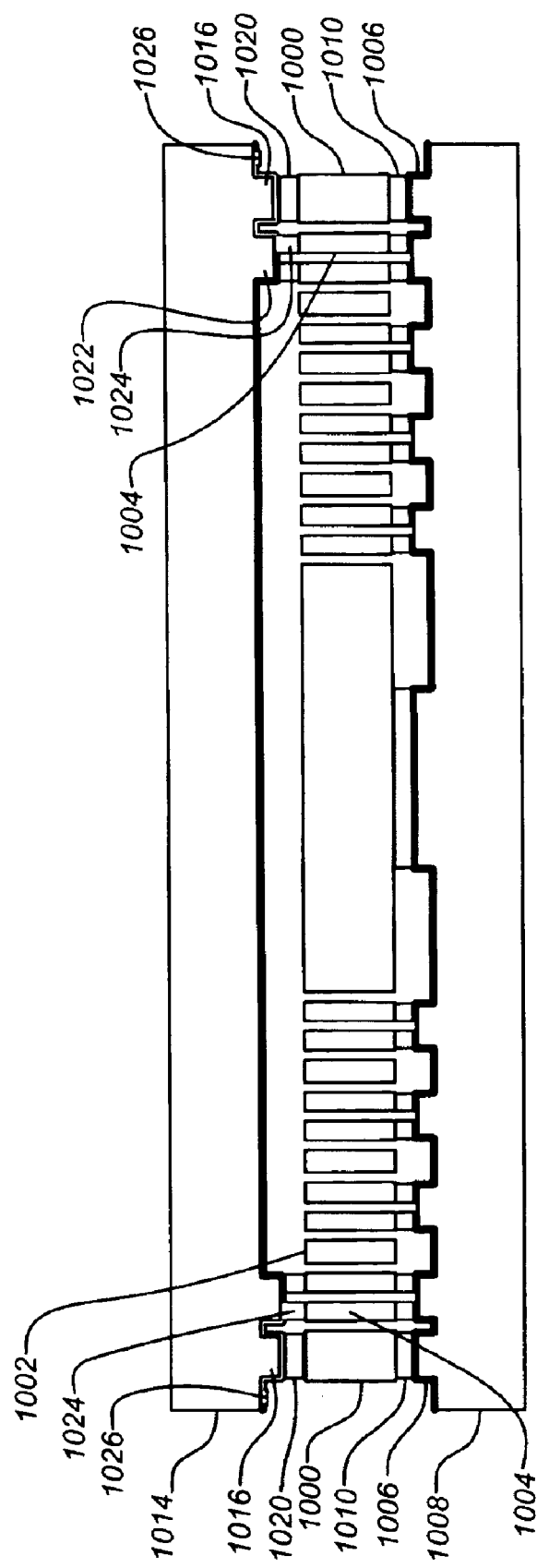
FIG. 10D illustrates a further embodiment with electrical feedouts to the excitation sensing and bias electrodes provided on the end cap wafer.

FIG. 10D illustrates a further embodiment with electrical feedouts to the excitation sensing and bias electrodes provided on the end cap wafer. The end cap wafer 1014 is etched to include electrode pillars 1022. Similar to the embodiment shown in FIG. 6E with metal traces 638 (e.g., Au) formed on the baseplate wafer 600, metal traces 1026 are formed on the end cap wafer 1014 connected to fused bonding pads 1024 of the top of the electrode (formed along with the bonding line 1012) and of the electrode pillar 1022 (formed along with the bonding line 1018). In order to electrically isolate passage through the vacuum seal 1020, a second SiO$_2$ layer 1016 is applied over the metal trace 1026 at least in the area that passes through the seal 1020. Although the electrical connection is shown to only two electrodes, other or all electrodes 1004 of the resonator 1002 can be so connected, patterned onto the surface of the end cap wafer 1014 to pass through the finished vacuum cavity wall 1000. Alternately, more space can be provided between the vacuum cavity wall 1000 and the resonator so that vertical connect pins can be arranged to pass through the end cap wafer 1014 from a point within the vacuum cavity wall 1000, similar to the arrangement shown in FIG. 6E with the baseplate wafer 600. Also, the electrodes 1004 which are used connected to metal traces 1026 on the end cap wafer 1014 can be considered "vertical connect pins" because they can be used to connect metal traces on the baseplate wafer 1008 with metal traces 1026 on the end cap wafer 1014.

Figure 10E:
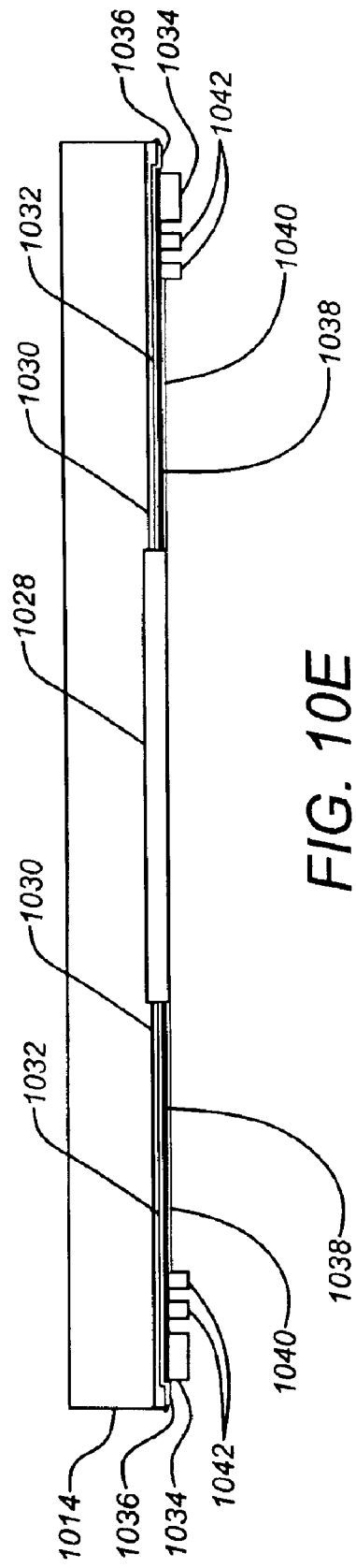
FIG. 10E illustrates yet another embodiment where the end cap wafer includes the control electronics for the gyro.

FIG. 10E illustrates yet another embodiment where the end cap wafer 1014 includes the control electronics 1028 for the gyro. The end cap wafer 1014 can be produced including the control electronics 1028, e.g. an CMOS application specific integrated circuit (ASIC) device. Application of the control electronics 1028 to the end cap wafer 1014 includes applying metal traces 1032 (e.g., Al) over a first SiO$_2$ layer 1030. The metal traces 1032 lead from the control electronics 1028 under the bonding line 1034 for the vacuum seal to contact pads 1036 which communicate electrical power and control and rate signals to and from the control electronics 1028. Alternately, the metal traces 1032 can be eliminated in favor of vertical connect pins (not shown) which pass through the end cap wafer 1014. In this case contacts are provided on the top side of the integrated device. A second SiO$_2$ layer 1038 is applied over the metal traces 1032 of the control electronics 1028 to isolate a second layer of metal traces 1040 which couple the control electronics 1028 to the excitation, sensing and bias electrodes through bonding pads 1042.

Figure 10F:
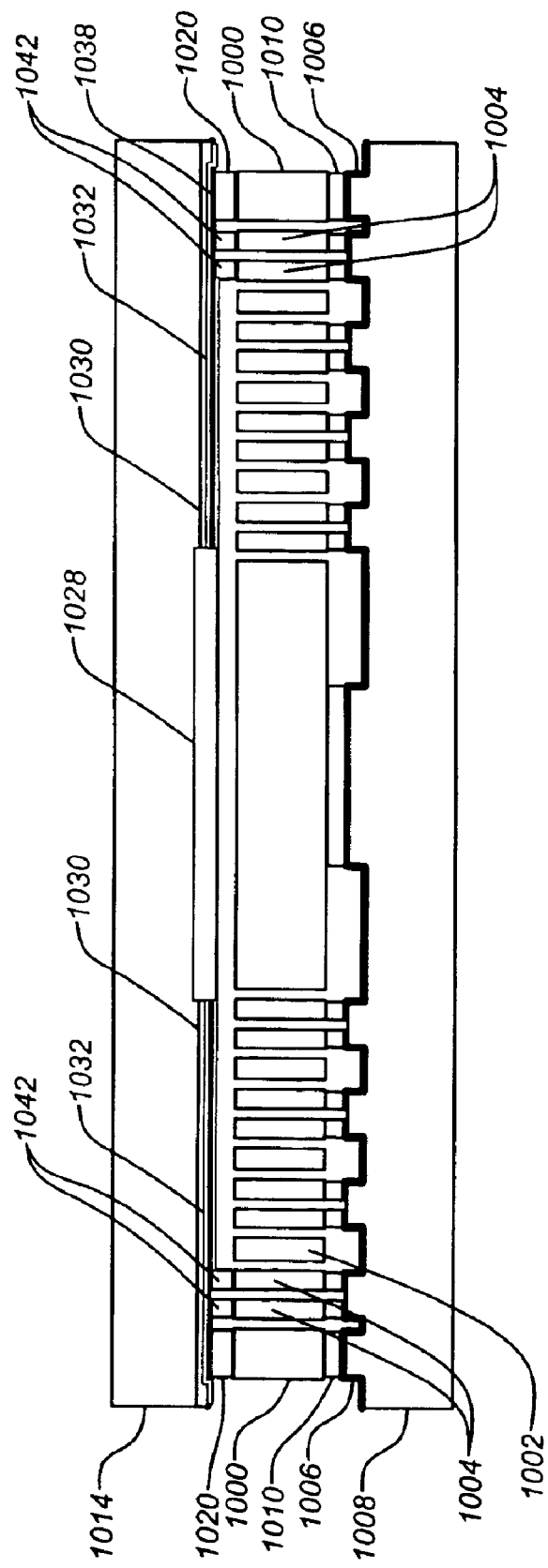
FIG. 10F illustrates the integrated end cap wafer including the control electronics.

FIG. 10F illustrates the integrated end cap wafer 1014 including the control electronics 1028. As with previous embodiments, the bonding line 1034 is fused to form the vacuum seal 1020 around the perimeter of the integrated device. Similarly, the bonding pads 1042 are fused to the various excitation, sensing and bias electrodes 1004.

The specific feature of the device design that enables relatively seamless subsequent integration with the CMOS control electronics is the presence of the "vertical connect pins" that bring signal lines from the baseplate wafer where the connections to the electrodes are made to the top surface of the device wafer pair. The pins can be connected to the feed-through lines on the end cap wafer or to the relevant metallization on the CMOS electronics during the bonding process. The bonding process which makes these electrical connections also creates the vacuum sealed cavity that houses the gyroscope resonator. The bonding can be performed with a solder reflow (such as Au—Sn) which ensures a vacuum-tight seal and a high quality electrical connection.

A proper choice of the device wafer pair and end cap wafer/device pair bonding methods is important to both ensure a tight vacuum seal and to maintain electrical connectivity and mechanical integrity. In particular, the device wafer pair should be bonded with a higher temperature process, such as a Au thermal compression or Au—Si eutectic, while the readout electronics wafer should be bonded with a lower temperature process, such as Au—Sn or Au—In. This is done to maintain the mechanical integrity of free-standing electrodes during the readout electronics wafer bonding phase.

Since the planar resonator to baseplate bond can be accomplished by a robust Au/Si eutectic bond, a solder seal ring approach can be used for end cap wafer to resonator wafer bond with a melting point of approximately 300° C. This will allow the gyro to operate in a temperature environment as high approximately 200° C. if needed. The silicon planar resonator wafer and baseplate pair can be bonded directly to a Si readout electronics wafer (end cap wafer) containing CMOS control electronics in order to reduce the induced capacitive variations in a high g-environment. By connecting the gyro sense and control electrodes directly to the control electronics on the Si readout electronics wafer using Au/Si eutectic bonding, the overall robustness to high g-loading and thermal variations can be increased. In addition, since the gyro structure will form part of the readout electronics wafer, the electronics integration and the wafer vacuum encapsulation is accomplished in one fabrication step.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the invention. Since many embodiments of the invention can be made without departing from the scope of the invention, the invention resides in the claims hereinafter appended.

What is claimed is:

1. A method of producing a sensor comprising the steps of:
   etching a baseplate;
   bonding a wafer to the etched baseplate;
   through etching the wafer to form a planar mechanical resonator;
   through etching the wafer to form a wall of a resonator case; and
   bonding an end cap wafer to the wall to complete the resonator case;
   wherein the resonator case comprises a vacuum housing.

2. The method of claim 1, further comprising grinding and polishing the through-etched wafer to a desired thickness.

3. The method of claim 1, wherein connect pins pass electrical signals through the resonator case from the baseplate to the end cap wafer of the resonator case to provide electrical connection for exciting the resonator and sensing motion of the resonator.

4. The method of claim 1, further comprising control electronics within the resonator case for exciting and sensing movement of the resonator.

5. The method of claim 1, wherein metal traces pass through the resonator case to provide electrical connection for exciting the resonator and sensing motion of the resonator.

6. The method of claim 1, further comprising through etching the wafer to produce at least one excitation electrode within an interior of the planar mechanical resonator to excite in-plane vibration of the resonator; and
   through etching the wafer to produce at least one sensing electrode within the interior of the resonator for sensing the motion of the excited resonator.

7. The method of claim 1, further comprising through etching connect pins from the wafer to pass electrical signals from the baseplate to the end cap wafer of the resonator case to provide electrical connection for exciting and sensing movement of the resonator.

8. The method of claim 1, wherein the resonator and the wall are produced from a common etching process.

9. The method of claim 1, further comprising fusing the baseplate to the wall and the wall to the end cap wafer with metal bonding to vacuum seal the resonator case.

10. The method of claim 1, wherein the end cap wafer includes control electronics for exciting the resonator and sensing motion of the resonator.

11. The method of claim 10, wherein the control electronics are within the resonator case.

12. The method of claim 10, wherein electrical signals of exciting and sensing electrodes of the resonator are connected from baseplate metal traces by connect pins to the end cap wafer of the resonator case to provide electrical connection with the control electronics on the end cap wafer.

13. The method of claim 12, wherein end cap metal traces pass through the resonator ease between the wall and the end cap to communicate sensing information from the control electronics.

14. The method of claim 1, wherein through etching the wafer to form the planar mechanical resonator comprises through etching a plurality slots.

15. The method of claim 14, wherein the plurality of slots are arranged in an annular pattern around a central mounting point.

16. The method of claim 14, wherein the plurality of slots are arranged with substantially uniform radial spacing around a central mounting point.

17. The method of claim 14, wherein the plurality of slots are arranged in a symmetric pattern.

18. The method of claim 14, wherein through etching to form the plurality of slots also forms at least one excitation electrode disposed within one or more of the plurality of slots.

19. The method of claim 18, wherein the at least one excitation electrode is disposed within one or more inner slots of the plurality of slots.

20. The method of claim 14, wherein through etching to form the plurality of slots also forms at least one sensing electrode disposed within one or more of the plurality of slots.

21. The method of claim 20, wherein the at least one sensing electrode is disposed within one or more outer slots of the plurality of slots.

22. The method of claim 1, bonding the wafer to the baseplate and through etching the wafer forms a rigid support for the planer resonator at a central mounting point of the resonator for in-plane vibration.

23. The method of claim 22, wherein the in-plane vibration comprises substantially radial motion about the central mounting point.

24. The method of claim 22, wherein vibration of the planar resonator is substantially isolated from the rigid support.

25. The method of claim 1, wherein the planar mechanical resonator comprises four masses, each having a simple degenerate pair of in-plane vibration modes.

26. The method of claim 25, wherein the planar mechanical resonator has two degenerate in-plane system modes producing symmetric motion of the four masses for Coriolis sensing.

27. A method of producing a sensor comprising the steps of:
etching a baseplate;
bonding a wafer to the etched baseplate;
through etching the wafer to form a planar mechanical resonator;
through etching the wafer to form a wall of a resonator case; and
bonding an end cap wafer to the wall to complete the resonator case;
wherein control electronics are disposed within the resonator case for exciting and sensing movement of the resonator.

28. The method of claim 27, further comprising grinding and polishing the through-etched wafer to a desired thickness.

29. The method of claim 27, wherein the resonator case comprises a vacuum housing.

30. The method of claim 27, wherein connect pins pass electrical signals through the resonator case from the baseplate to the end cap wafer of the resonator case to provide electrical connection for exciting the resonator and sensing motion of the resonator.

31. The method of claim 27, wherein metal traces pass through the resonator case to provide electrical connection for exciting the resonator and sensing motion of the resonator.

32. The method of claim 27, further comprising through etching the wafer to produce at least one excitation electrode within an interior of the planar mechanical resonator to excite in-plane vibration of the resonator; and
through etching the wafer to produce at least one sensing electrode within the interior of the resonator for sensing the motion of the excited resonator.

33. The method of claim 27, further comprising through etching connect pins from the wafer to pass electrical signals from the baseplate to the end cap wafer of the resonator case to provide electrical connection for exciting and sensing movement of the resonator.

34. The method of claim 27, wherein the resonator and the wall are produced from a common etching process.

35. The method of claim 27, further comprising fusing the baseplate to the wall and the wall to the end cap wafer with metal bonding to vacuum seal the resonator case.

36. The method of claim 27, wherein the end cap wafer includes control electronics for exciting the resonator and sensing motion of the resonator.

37. The method of claim 36, wherein electrical signals of exciting and sensing electrodes of the resonator are connected from baseplate metal traces by connect pins to the end cap wafer of the resonator case to provide electrical connection with the control electronics on the end cap wafer.

38. The method of claim 37, wherein end cap metal traces pass through the resonator case between the wall and the end cap to communicate sensing information from the control electronics.

39. The method of claim 27, wherein through etching the wafer to form the planar mechanical resonator comprises through etching a plurality slots.

40. The method of claim 39, wherein the plurality of slots are arranged in an annular pattern around a central mounting point.

41. The method of claim 39, wherein the plurality of slots are arranged with substantially uniform radial spacing around a central mounting point.

42. The method of claim 39, wherein the plurality of slots are arranged in a symmetric pattern.

43. The method of claim 39, wherein through etching to form the plurality of slots also forms at least one excitation electrode disposed within one or more of the plurality of slots.

44. The method of claim 43, wherein the at least one excitation electrode is disposed within one or more inner slots of the plurality of slots.

45. The method of claim 39, wherein through etching to form the plurality of slots also forms at least one sensing electrode disposed within one or more of the plurality of slots.

46. The method of claim 45, wherein the at least one sensing electrode is disposed within one or more outer slots of the plurality of slots.

47. The method of claim 27, bonding the wafer to the baseplate and through etching the wafer forms a rigid support for the planar resonator at a central mounting point of the resonator for in-plane vibration.

48. The method of claim 47, wherein the in-plane vibration comprises substantially radial motion about the central mounting point.

49. The method of claim 47, wherein vibration of the planar resonator is substantially isolated from the rigid support.

50. The method of claim 27, wherein the planar mechanical resonator comprises four masses, each baying a simple degenerate pair of in-plane vibration modes.

51. The method of claim 50, wherein the planar mechanical resonator has two degenerate in-plane system modes producing symmetric motion of the four masses for Coriolis sensing.

* * * * *